US011732353B2

(12) United States Patent
Chatterjee et al.

(10) Patent No.: US 11,732,353 B2
(45) Date of Patent: *Aug. 22, 2023

(54) METHODS OF PROTECTING AEROSPACE COMPONENTS AGAINST CORROSION AND OXIDATION

(71) Applicant: Applied Materials, Inc., Santa Clara, CA (US)

(72) Inventors: Sukti Chatterjee, San Jose, CA (US); Lance A. Scudder, Sunnyvale, CA (US); Yuriy Melnik, San Jose, CA (US); David A. Britz, San Jose, CA (US); Thomas Knisley, Livonia, MI (US); Kenichi Ohno, Sunnyvale, CA (US); Pravin K. Narwankar, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 135 days.

This patent is subject to a terminal disclaimer.

(21) Appl. No.: 16/850,856

(22) Filed: Apr. 16, 2020

(65) Prior Publication Data

US 2020/0340107 A1 Oct. 29, 2020

Related U.S. Application Data

(60) Provisional application No. 62/839,186, filed on Apr. 26, 2019.

(51) Int. Cl.
| | |
|---|---|
| *C23C 16/40* | (2006.01) |
| *C23C 16/455* | (2006.01) |
| *C23C 28/02* | (2006.01) |
| *C23C 16/56* | (2006.01) |
| *B64F 5/40* | (2017.01) |

(52) U.S. Cl.
CPC .......... *C23C 16/403* (2013.01); *C23C 16/405* (2013.01); *C23C 16/45525* (2013.01); *C23C 16/56* (2013.01); *C23C 28/02* (2013.01); *B64F 5/40* (2017.01)

(58) Field of Classification Search
CPC .................................................. C23C 28/02
See application file for complete search history.

(56) References Cited

U.S. PATENT DOCUMENTS

| | | | |
|---|---|---|---|
| 4,698,130 A | 10/1987 | Restall et al. | |
| 5,217,757 A | 6/1993 | Olson et al. | |
| 5,362,228 A | 11/1994 | Vaudel | |
| 5,503,874 A | 4/1996 | Ackerman et al. | |
| 5,538,796 A | 7/1996 | Schaffer et al. | |
| 5,631,171 A | 5/1997 | Sandstrom et al. | |
| 5,805,973 A | 9/1998 | Coffinberry et al. | |
| 5,891,584 A | 4/1999 | Coffinberry | |
| 5,912,069 A | 6/1999 | Yializis et al. | |
| 5,950,925 A | 9/1999 | Fukunaga et al. | |
| 6,042,898 A | 3/2000 | Burns et al. | |
| 6,082,444 A | 7/2000 | Harada et al. | |
| 6,107,186 A | 8/2000 | Erb | |
| 6,132,890 A | 10/2000 | Harada et al. | |
| 6,156,382 A | 12/2000 | Rajagopalan et al. | |
| 6,162,715 A | 12/2000 | Mak et al. | |
| 6,207,295 B1 | 3/2001 | Stowell et al. | |
| 6,245,192 B1 | 6/2001 | Dhindsa et al. | |
| 6,309,713 B1 | 10/2001 | Mak et al. | |
| 6,332,926 B1 | 12/2001 | Pfaendtner et al. | |
| 6,359,089 B2 | 3/2002 | Hung et al. | |
| 6,379,466 B1 | 4/2002 | Sahin et al. | |
| 6,387,526 B1 | 5/2002 | Beele | |
| 6,402,898 B1 | 6/2002 | Brumer et al. | |
| 6,437,066 B1 | 8/2002 | Hung et al. | |
| 6,459,477 B1 | 10/2002 | Berlin et al. | |
| 6,465,040 B2 | 10/2002 | Gupta et al. | |

(Continued)

FOREIGN PATENT DOCUMENTS

| | | |
|---|---|---|
| CN | 101302610 A | 11/2008 |
| CN | 104647828 A | 5/2015 |

(Continued)

OTHER PUBLICATIONS

International Search Report and Written Opinion dated Feb. 2, 2021 for Application No. PCT/US2020/056618.
Liu et al. "Ultrathin high-temperature oxidation-resistant coatings of hexagonal boron nitride" Nature Communications; doi: 10.1038/ncomms3541; Pub. Oct. 4, 2013, 8 pages.
Calderon "Boron Nitride Growth and Electronics", Cornell University, May 2018.
Auwarter "Hexagonal boron nitride monolayers on metal supports: Versatile templates for atoms, molecules and nanostructures", Surface Science Reports 74 (2019) 1-95.
International Search Report and Written Report for International Application No. PCT/US2020/027247 dated Jul. 31, 2020, 9 pages.
International Search Report and the Written Opinion for International Application No. PCT/US2020/028462 dated Jul. 29, 2020, 11 pages.

(Continued)

*Primary Examiner* — Tabatha L Penny
(74) *Attorney, Agent, or Firm* — Patterson + Sheridan, LLP

(57) ABSTRACT

Embodiments of the present disclosure generally relate to protective coatings on an aerospace component and methods for depositing the protective coatings. In one or more embodiments, a method for depositing a coating on an aerospace component includes depositing one or more layers on a surface of the aerospace component using an atomic layer deposition or chemical vapor deposition process, and performing a partial oxidation and annealing process to convert the one or more layers to a coalesced layer having a preferred phase crystalline assembly. During oxidation cycles, an aluminum depleted region is formed at the surface of the aerospace component, and an aluminum oxide region is formed between the aluminum depleted region and the coalesced layer. The coalesced layer forms a protective coating, which decreases the rate of aluminum depletion from the aerospace component and the rate of new aluminum oxide scale formation.

12 Claims, 4 Drawing Sheets

(56) References Cited

U.S. PATENT DOCUMENTS

| | | | |
|---|---|---|---|
| 6,495,271 B1 * | 12/2002 | Vakil | C23C 28/00 428/632 |
| 6,544,665 B2 | 4/2003 | Rigney et al. | |
| 6,551,929 B1 | 4/2003 | Kori et al. | |
| 6,582,772 B2 | 6/2003 | Rigney et al. | |
| 6,607,976 B2 | 8/2003 | Chen et al. | |
| 6,620,670 B2 | 9/2003 | Song et al. | |
| 6,620,723 B1 | 9/2003 | Byun et al. | |
| 6,620,956 B2 | 9/2003 | Chen et al. | |
| 6,630,244 B1 | 10/2003 | Mao et al. | |
| 6,677,247 B2 | 1/2004 | Yuan et al. | |
| 6,740,585 B2 | 5/2004 | Yoon et al. | |
| 6,784,096 B2 | 8/2004 | Chen et al. | |
| 6,797,340 B2 | 9/2004 | Fang et al. | |
| 6,800,376 B1 | 10/2004 | Gupta et al. | |
| 6,805,750 B1 | 10/2004 | Ristau et al. | |
| 6,809,026 B2 | 10/2004 | Yoon et al. | |
| 6,811,814 B2 | 11/2004 | Chen et al. | |
| 6,821,891 B2 | 11/2004 | Chen et al. | |
| 6,825,134 B2 | 11/2004 | Law et al. | |
| 6,827,978 B2 | 12/2004 | Yoon et al. | |
| 6,831,021 B2 | 12/2004 | Chua et al. | |
| 6,833,161 B2 | 12/2004 | Wang et al. | |
| 6,838,125 B2 | 1/2005 | Chung et al. | |
| 6,846,516 B2 | 1/2005 | Yang et al. | |
| 6,869,838 B2 | 3/2005 | Law et al. | |
| 6,872,429 B1 | 3/2005 | Chen et al. | |
| 6,887,588 B2 | 5/2005 | Ackerman et al. | |
| 6,887,589 B2 | 5/2005 | Darolia et al. | |
| 6,905,939 B2 | 6/2005 | Yuan et al. | |
| 6,911,391 B2 | 6/2005 | Yang et al. | |
| 6,921,251 B2 | 7/2005 | Ackerman et al. | |
| 6,924,191 B2 | 8/2005 | Liu et al. | |
| 6,936,538 B2 | 8/2005 | Byun | |
| 6,939,801 B2 | 9/2005 | Chung et al. | |
| 6,939,804 B2 | 9/2005 | Lai et al. | |
| 6,949,342 B2 | 9/2005 | Golub et al. | |
| 6,951,804 B2 | 10/2005 | Seutter et al. | |
| 6,972,267 B2 | 12/2005 | Cao et al. | |
| 6,979,498 B2 | 12/2005 | Darolia et al. | |
| 7,011,947 B2 | 3/2006 | Golub et al. | |
| 7,026,238 B2 | 4/2006 | Xi et al. | |
| 7,041,335 B2 | 5/2006 | Chung | |
| 7,049,226 B2 | 5/2006 | Chung et al. | |
| 7,081,271 B2 | 7/2006 | Chung et al. | |
| 7,101,795 B1 | 9/2006 | Xi et al. | |
| 7,172,820 B2 | 2/2007 | Darolia et al. | |
| 7,211,144 B2 | 5/2007 | Lu et al. | |
| 7,211,508 B2 | 5/2007 | Chung et al. | |
| 7,241,686 B2 | 7/2007 | Marcadal et al. | |
| 7,244,683 B2 | 7/2007 | Chung et al. | |
| 7,262,133 B2 | 8/2007 | Chen et al. | |
| 7,264,846 B2 | 9/2007 | Chang et al. | |
| 7,265,048 B2 | 9/2007 | Chung et al. | |
| 7,279,432 B2 | 10/2007 | Xi et al. | |
| 7,285,312 B2 | 10/2007 | Li | |
| 7,317,229 B2 | 1/2008 | Hung et al. | |
| 7,371,467 B2 | 5/2008 | Han et al. | |
| 7,374,825 B2 | 5/2008 | Hazel et al. | |
| 7,396,565 B2 | 7/2008 | Yang et al. | |
| 7,404,985 B2 | 7/2008 | Chang et al. | |
| 7,405,158 B2 | 7/2008 | Lai et al. | |
| 7,416,979 B2 | 8/2008 | Yoon et al. | |
| 7,429,402 B2 | 9/2008 | Gandikota et al. | |
| 7,429,540 B2 | 9/2008 | Olsen | |
| 7,439,191 B2 | 10/2008 | Law et al. | |
| 7,445,434 B2 | 11/2008 | Harada et al. | |
| 7,449,761 B2 | 11/2008 | Nakagawa | |
| 7,473,655 B2 | 1/2009 | Wang et al. | |
| 7,501,248 B2 | 3/2009 | Golub et al. | |
| 7,507,660 B2 | 3/2009 | Chen et al. | |
| 7,531,468 B2 | 5/2009 | Metzner et al. | |
| 7,547,952 B2 | 6/2009 | Metzner et al. | |
| 7,569,501 B2 | 8/2009 | Metzner et al. | |
| 7,573,586 B1 | 8/2009 | Boyer et al. | |
| 7,579,085 B2 | 8/2009 | Hazel | |
| 7,585,762 B2 | 9/2009 | Shah et al. | |
| 7,595,263 B2 | 9/2009 | Chung et al. | |
| 7,601,652 B2 | 10/2009 | Singh et al. | |
| 7,651,955 B2 | 1/2010 | Ranish et al. | |
| 7,732,327 B2 | 6/2010 | Lee et al. | |
| 7,737,028 B2 | 6/2010 | Wang et al. | |
| 7,740,960 B1 | 6/2010 | Zhu et al. | |
| 7,776,395 B2 | 8/2010 | Mahajani | |
| 7,816,200 B2 | 10/2010 | Kher | |
| 7,824,743 B2 | 11/2010 | Lee et al. | |
| 7,833,358 B2 | 11/2010 | Chu et al. | |
| 7,833,586 B2 | 11/2010 | Margolies | |
| 7,846,840 B2 | 12/2010 | Kori et al. | |
| 7,867,900 B2 | 1/2011 | Lee et al. | |
| 7,875,119 B2 | 1/2011 | Gartland et al. | |
| 7,910,165 B2 | 3/2011 | Ganguli et al. | |
| 7,910,231 B2 | 3/2011 | Schuh et al. | |
| 7,910,446 B2 | 3/2011 | Ma et al. | |
| 7,964,505 B2 | 6/2011 | Khandelwal et al. | |
| 7,972,978 B2 | 7/2011 | Mahajani | |
| 8,043,907 B2 | 10/2011 | Ma et al. | |
| 8,056,652 B2 | 11/2011 | Lockwood et al. | |
| 8,114,852 B2 | 2/2012 | Borca et al. | |
| 8,192,941 B2 | 6/2012 | Kuersten | |
| 8,227,078 B2 | 7/2012 | Morra et al. | |
| 8,277,670 B2 | 10/2012 | Heo et al. | |
| 8,426,575 B2 | 4/2013 | Borca et al. | |
| 8,439,137 B1 | 5/2013 | Galloway | |
| 8,470,460 B2 | 6/2013 | Lee | |
| 8,555,921 B2 | 10/2013 | Brondum et al. | |
| 8,721,812 B2 | 5/2014 | Furrer et al. | |
| 8,741,420 B2 | 6/2014 | Bunker et al. | |
| 8,871,297 B2 | 10/2014 | Barnett et al. | |
| 8,932,816 B2 | 1/2015 | Kuersten | |
| 9,255,327 B2 | 2/2016 | Winter et al. | |
| 9,347,145 B2 | 5/2016 | Bessho | |
| 9,416,406 B2 | 8/2016 | Kuersten | |
| 9,624,534 B2 | 4/2017 | Kuersten | |
| 9,683,281 B2 | 6/2017 | Meehan et al. | |
| 9,777,583 B2 | 10/2017 | Leggett | |
| 9,873,940 B2 | 1/2018 | Xu et al. | |
| 10,072,335 B2 | 9/2018 | Marquardt et al. | |
| 10,233,760 B2 | 3/2019 | Lee | |
| 10,287,899 B2 | 5/2019 | Dierberger | |
| 10,369,593 B2 | 8/2019 | Barnett et al. | |
| 10,443,142 B2 | 10/2019 | Miettinen et al. | |
| 10,488,332 B2 | 11/2019 | Kessler et al. | |
| 10,633,740 B2 | 4/2020 | Melnik et al. | |
| 10,760,158 B2 | 9/2020 | Shanbhag et al. | |
| 11,028,480 B2 | 6/2021 | Knisley et al. | |
| 2002/0002258 A1 | 1/2002 | Hung et al. | |
| 2002/0045782 A1 | 4/2002 | Hung et al. | |
| 2002/0117399 A1 | 8/2002 | Chen et al. | |
| 2002/0127336 A1 | 9/2002 | Chen et al. | |
| 2002/0136824 A1 | 9/2002 | Gupta et al. | |
| 2003/0010451 A1 | 1/2003 | Tzu et al. | |
| 2003/0057526 A1 | 3/2003 | Chung et al. | |
| 2003/0059535 A1 | 3/2003 | Luo et al. | |
| 2003/0059538 A1 | 3/2003 | Chung et al. | |
| 2003/0059633 A1 | 3/2003 | Ackerman et al. | |
| 2003/0072884 A1 | 4/2003 | Zhang et al. | |
| 2003/0082301 A1 | 5/2003 | Chen et al. | |
| 2003/0123216 A1 | 7/2003 | Yoon et al. | |
| 2003/0124262 A1 | 7/2003 | Chen et al. | |
| 2003/0132319 A1 | 7/2003 | Hytros et al. | |
| 2003/0134300 A1 | 7/2003 | Golub et al. | |
| 2003/0136520 A1 | 7/2003 | Yudovsky et al. | |
| 2003/0139005 A1 | 7/2003 | Song et al. | |
| 2003/0145875 A1 | 8/2003 | Han et al. | |
| 2003/0152980 A1 | 8/2003 | Golub et al. | |
| 2003/0157760 A1 | 8/2003 | Xi et al. | |
| 2003/0172872 A1 | 9/2003 | Thakur et al. | |
| 2003/0198754 A1 | 10/2003 | Xi et al. | |
| 2003/0203616 A1 | 10/2003 | Chung et al. | |
| 2003/0215570 A1 | 11/2003 | Seutter et al. | |
| 2003/0235961 A1 | 12/2003 | Metzner et al. | |
| 2004/0009665 A1 | 1/2004 | Chen et al. | |
| 2004/0013803 A1 | 1/2004 | Chung et al. | |

(56) References Cited

U.S. PATENT DOCUMENTS

| | | |
|---|---|---|
| 2004/0018738 A1 | 1/2004 | Liu |
| 2004/0038086 A1* | 2/2004 | Litton .................... C23C 14/08 |
| | | 428/700 |
| 2004/0057832 A1 | 3/2004 | Fleck et al. |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0129849 A1 | 6/2005 | Ackerman et al. |
| 2005/0158590 A1* | 7/2005 | Li ........................ C23C 28/3455 |
| | | 428/698 |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0093849 A1 | 5/2006 | Farmer et al. |
| 2006/0115659 A1 | 6/2006 | Hazel et al. |
| 2006/0115660 A1* | 6/2006 | Strangman ............... C23C 26/00 |
| | | 427/372.2 |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0160859 A1 | 7/2007 | Darolia et al. |
| 2007/0202254 A1 | 8/2007 | Ganguli et al. |
| 2007/0224411 A1 | 9/2007 | Hazel et al. |
| 2007/0259111 A1 | 11/2007 | Singh et al. |
| 2007/0274837 A1 | 11/2007 | Taylor et al. |
| 2007/0292616 A1 | 12/2007 | Hazel |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0110903 A1 | 4/2009 | Margolies |
| 2009/0155976 A1 | 6/2009 | Ahn et al. |
| 2009/0169742 A1 | 7/2009 | Hazel |
| 2009/0181051 A1 | 7/2009 | Borca et al. |
| 2009/0186237 A1 | 7/2009 | Lee |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0151125 A1 | 6/2010 | Kool et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2010/0279305 A1 | 11/2010 | Kuersten |
| 2011/0017997 A1 | 1/2011 | Kamath et al. |
| 2011/0045209 A1 | 2/2011 | Seleznev |
| 2011/0175038 A1 | 7/2011 | Hou et al. |
| 2011/0293825 A1 | 12/2011 | Atwal et al. |
| 2012/0014992 A1 | 1/2012 | Borca et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0295794 A1 | 11/2012 | Kuersten |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2013/0295298 A1 | 11/2013 | Gatineau et al. |
| 2013/0331275 A1 | 12/2013 | Kuersten |
| 2014/0065438 A1 | 3/2014 | Lee |
| 2014/0103284 A1 | 4/2014 | Hsueh et al. |
| 2014/0242298 A1 | 8/2014 | Lansalot-Matras et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0099268 A1 | 4/2015 | Kuersten |
| 2015/0170961 A1 | 6/2015 | Romero et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060746 A1 | 3/2016 | Ramm |
| 2016/0060758 A1 | 3/2016 | Marquardt et al. |
| 2016/0181627 A1* | 6/2016 | Roeder ............... H01M 8/0228 |
| | | 429/516 |
| 2016/0251972 A1 | 9/2016 | Dierberger |
| 2016/0281230 A1 | 9/2016 | Varadarajan et al. |
| 2016/0281511 A1 | 9/2016 | Hille et al. |
| 2016/0298222 A1 | 10/2016 | Meehan et al. |
| 2016/0300709 A1 | 10/2016 | Posseme et al. |
| 2016/0312277 A1 | 10/2016 | Kuersten |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0153880 A1 | 5/2019 | Lee |
| 2019/0185999 A1 | 6/2019 | Shanbhag et al. |

(56) References Cited

U.S. PATENT DOCUMENTS

| | | |
|---|---|---|
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1 | 9/2019 | Task |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |
| 2020/0347497 A1 | 11/2020 | Shanbhag et al. |
| 2020/0361124 A1 | 11/2020 | Britz |
| 2020/0392626 A1 | 12/2020 | Chatterjee et al. |
| 2021/0292901 A1 | 9/2021 | Knisley et al. |
| 2022/0298920 A1 | 9/2022 | Melnik et al. |

FOREIGN PATENT DOCUMENTS

| | | | |
|---|---|---|---|
| CN | 107313027 A | 11/2017 | |
| EP | 0209307 A1 | 1/1987 | |
| EP | 0387113 B1 | 12/1993 | |
| EP | 0645472 A1 | 3/1995 | |
| EP | 1361338 A2 | 11/2003 | |
| EP | 1431372 A2 | 6/2004 | |
| EP | 1236812 B1 | 5/2006 | |
| EP | 2022868 A2 | 2/2009 | |
| EP | 2103707 A1 | 9/2009 | |
| EP | 2194164 A1 | 6/2010 | |
| EP | 2392895 A1 | 12/2011 | |
| EP | 2161352 B1 | 2/2014 | |
| EP | 3540092 A1 | 9/2019 | |
| EP | 3227474 B1 | 11/2019 | |
| GB | 2455993 A * | 7/2009 | ........... C23C 28/044 |
| JP | 2823086 B2 | 11/1998 | |
| JP | 2001342556 A | 12/2001 | |
| JP | 2003013745 A | 1/2003 | |
| JP | 2003164819 A | 6/2003 | |
| JP | 2006010403 A | 1/2006 | |
| JP | 2006199988 A | 8/2006 | |
| JP | 2007182631 A | 7/2007 | |
| KR | 20060106104 A | 10/2006 | |
| KR | 20110014989 A | 2/2011 | |
| KR | 101192248 B1 | 10/2012 | |
| KR | 20170063149 A | 6/2017 | |
| KR | 101761736 B1 | 7/2017 | |
| KR | 20170140354 A | 12/2017 | |
| RU | 2630733 C2 | 9/2017 | |
| TW | 201812075 A | 4/2018 | |
| WO | 9631687 A1 | 10/1996 | |
| WO | 00/09778 A1 | 2/2000 | |
| WO | 2005059200 A1 | 6/2005 | |
| WO | 2014159267 A1 | 10/2014 | |
| WO | 2015047783 A1 | 4/2015 | |
| WO | 2019182967 A1 | 9/2019 | |
| WO | 2021071567 A1 | 4/2021 | |

OTHER PUBLICATIONS

International Search Report and Written Opinion dated Oct. 30, 2020 for Application No. PCT/US2020/041382.

Taiwan Office Action dated Dec. 21, 2020 for Application No. 109113600.

Lang, E., "The Role of Active Elements in the Oxidation Behaviour of High Temperature Metals and Alloys" Elsevier, 1989, pp. 111-129 and 153.

International Search Report and Written Opinion dated Jun. 24, 2020 for Application No. PCT/US2020/019151.

International Search Report and Written Opinion dated Jul. 6, 2020 for Application No. PCT/US2020/024285.

Tsai, S.C. et al., "Growth mechanism of Cr2O3 scales: oxygen and chromium diffusion, oxidation kinetics and effect of yttrium", Elsevier, 1996, pp. 6-13.

PCT International Search Report and the Written Opinion for International Application No. PCT/US2019/041181; dated Oct. 25, 2019; 15 total pages.

Knisley, Thomas J. et al., "Volatility and High Thermal Stability in Mid- to Late-First-Row Transition-Metal Diazadienyl Complexes", American Chemical Society Publications, Aug. 25, 2011, pp. 5010-5017.

"A Review on Alumina-Chrome (AL2O3—CR2O3) and Chrome-Silica (CR2O3—SIO2) Refractories Along With Their Binary Phase Diagrams", 2009, http://www.idc-online.com/technical_references/pdfs/chemical_engineering/A_Review_on_Alumina_Chrome.pdf (Last visited date: May 2019).

Pettit, F.S. et al., "Oxidation and Hot Corrosion of Superalloys", TMS Publications, 1984, pp. 651-687.

Kaloyeros, Alain E., et al., "Review—Silicon Nitride and Silicon Nitride-Rich Thin Film Technologies: Trends in Deposition Techniques and Related Applications". ESC Journal of Solid State Science and Technology, 6 (10) P691-P714 (2017).

Vargas Garcia, J.R., et al., "Thermal barrier coatings produced by chemical vapor deposition". Science and Technology of Advanced Materials 4 (2003) 397-402.

Dyer, P.N., et al. "CVD Tungsten Carbide and Titanium Carbide Coatings for Aerospace Components" SAE Transactions, vol. 98, Section 1: Journal of Aerospace (1989), pp. 64-70. Abstract Only.

PCT Notification of Transmittal of the International Search Report and the Written Opinion of the International Searching Authority for International Application No. PCT/US2019/019113; dated Jun. 10, 2019; 11 total pages.

Taiwan Office Action dated Apr. 22, 2020 for Application No. 108106406.

"A Review on Alumina-Chrome (Al2O3—Cr2O3) and Chrome-Silica (Cr2O3-SiO2) Refractories along with their Binary Phase Diagrams," Nov. 18, 2009, 6 pages, <http://www.idc-online.com/technical_references/pdfs/chemical_engineering/A_Review_on_Alumina_Chrome.pdf>.

Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.

Dyer et al. "CVD Tungsten Carbide and Titanium Carbide Coatings for Aerospace Components," SAE Transactions, vol. 98, Section 1: Journal of Aerospace (1989), pp. 64-70. Abstract Only.

Fujita et al. "Sintering of Al2O3—Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.

He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.

Heidary et al. "Study on the behavior of atomic layer deposition coatings on a nickel substrate at high temperature," Nanotechnology, 27, 245701, 2016, pp. 1-32.

Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.

Kaloyeros et al. "Review-Silicon Nitrtide and Silicon Nitride-Rich Thin Film Technologies: Trends in Deposition Technniques and Related Application," ECS Journal of Solid State Science and Technology, vol. 6, No. 10, pp. P691-P714, 2017.

International Search Report and Written Opinion for International Application No. PCT/US2019/022788 dated Jul. 2, 2019, 9 pages.

International Search Report and Written Opinion for International Application No. PCT/US2019/022709 dated Jun. 28, 2019, 13 pages.

(56) References Cited

OTHER PUBLICATIONS

Knisley et al. "Volatility and High Thermal Stability in Mid to Late First Row Transition Metal Diazadienyl Complexes," Organometallics, 2011, vol. 30, No. 18, pp. 5010-5017.
Pettit et al. "Oxidation and Hot Corrosion of Superalloys," Jan. 1984, The Metal Society AIME, Warrendale, PA, pp. 651-687, <http://www.tms.org/superalloys/10.7449/1984/Superalloys_1984_651_687.pdf>.
Tsai et al. "Growth mechanism of Cr2O3 scales: oxygen and chromium diffusion, oxidation kinetics and effect of yttrium," Materials Science and Engineering A, vol. 212, No. 1, pp. 6-13, 1996, <https://doi.org/10.1016/0921-5093(96) 10173-8>.
Vargas Garcia et al. "Thermal barrier coatings produced by chemical vapor deposition," Science and Technology of Advanced Materials, vol. 4, No. 4, 2003, pp. 397-402.
Leppaniemi, Jarmo, et al., "Corrosion protection of steel with multilayer coatings: Improving the sealing properties of physical vapor deposition CrN coatings with Al2O3/TiO2atomic layer deposition nanolaminates". Thin Solid Films 627 (2017) pp. 59-68.
Ali, Muhammad Rostom, et al., "Electrodeposition of aluminum-chromium alloys from AI&BPC melt and its corrosion and high temperature oxidation behaviors" Electrochimica Acta, vol. 42. No 15, pp. 2347-2354, 1997.
Wu, Yanlin, et al., "Atomic Layer Deposition from Dissolved Precursors". Nano Letters 2015, 15, 6379-6385.
Johnson, Andrew L., et al., "Recent developments in molecular precursors for atomic layer deposition". Organomet. Chem., 2019, 42, 1-53.
Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.
Taiwan Office Action dated May 10, 2021 for Application No. 109126499.
European Search Report dated Jul. 26, 2021 for Application No. 19793402.9.
International Search Report and Written Opinion dated Sep. 28, 2021 for Application No. PCT/US2021/035874.
Extended European Search Report dated Oct. 4, 2021 for Application No. 19793402.9.
Taiwan Office Action dated Oct. 7, 2021 for Application No. 109126499.
International Search Report dated Dec. 1, 2021 for Application No. PCT/US2021/046245.
International Search Report and Written Opinion dated Dec. 2, 2021 for Application No. PCT/US2021/045766.
Wang et al., "Hydrogen permeation properties of CrxCy@Cr2O3/Al2O3 composite coating derived from selective oxidation of a Cr—C alloy and atomic layer deposition", International Journal of Hydrogen Energy, 43 (2018) pp. 21133-21141.
Liu et al., "Microstructural evolution of the interface between NiCrAlY coating and superalloy during isothermal oxidation", Materials and Design, 80 (2015) pp. 63-69.
Extended European Search Report dated Feb. 28, 2022 for Application No. 19771810.9.
Partial Supplementary European Search Report dated Feb. 10, 2022 for Application No. 19770951.2.
Chinese Office Action issued to Application No. 201980053426.4 dated Jan. 21, 2022.
International Search Report and Written Opinion dated Jul. 2, 2019 for Application No. PCT/US2019/022788.
International Search Report and Written Opinion for International Application No. PCT/US2019/022737 dated Jul. 2, 2019, 11 pages.
International Search Report and Writtne Opinion dated Jul. 2, 2019 for Application No. PCT/US2019/022737.
International Search Report issued to PCT/US2020/028462 dated Jul. 29, 2020.
International Search Report and Written Opinion dated Feb. 18, 2022 for Application No.
Taiwan Office Action dated Feb. 14, 2022 for Application No. 110136873.
Chinese Office Action dated Mar. 16, 2022 for Application No. 201980020460.1.
Volz et al., "Novel Nanolaminates for Aerospace Applications", Tennessee Valley Corridor Federal Alliance Collaborative Technology Forum: NANO Technology; Jul. 19, 2006, 12 pages.
Sammelselg et al., "Structural characterization of TiO2—Cr2O3 nanolaminates grown by atomic layer deposition"; Surface and Coatings Technology 204 (2010) 2015-2018.
Chinese Office Action dated Mar. 17, 2022 for Application No. 201980020567.6.
Extended European Search Report dated May 4, 2022 for Application No. 19770951.2.
European Search Report dated Apr. 29, 2022 for Application No. 19853051.1.
International Search Report and Written Opinion dated Jun. 30, 2022 for Application No. PCT/US2021/050721.
European Search Report dated Aug. 1, 2022 for Application No. 19853051.1.
Indian Office Action dated Jul. 22, 2022 for Application No. 202247033258.
Chinese Office Action dated Jul. 5, 2022 for Chinese Application No. 201980019149.5.
Chinese Office Action dated Aug. 17, 2022 for Application No. 201980020460.1.
Chinese Office Action dated Sep. 2, 2022 for Application No. 201980020567.6
Chinese Office Action issued to Applcation No. 201980053426.4 dated Aug. 26, 2022.
International Search Report and Written Opinion dated Nov. 6, 2020 for Application No. PCT/US2020/042444.
Extended Eurpoean Search Report dated Jan. 3, 2023 for Application No. 20804791.0.
Extended European Search Report dated Dec. 19, 2022 for Application No. 20796304.2, 17 pages.
Taiwan Application No. 110136873, Office Action dated Dec. 20, 2022, 4 pages.
Sitek, Influence of the high-temperature aluminizing process on the microstructure and corrosion resistance of the IN 740H nickel superalloy, https://doi.org/10.1016/j.vacuum.2018.08.047.
Niska et al., Chemical vapor deposition of alpha aluminum oxide for high-temperature aerospace sensors, Journal of Vacuum Science and Technology A: Vacuum, Surfaces and Films, vol. 18, Issue 4 11, https://doi.org/10.1116/1.582401.

* cited by examiner

METHODS OF PROTECTING AEROSPACE COMPONENTS AGAINST CORROSION AND OXIDATION

CROSS-REFERENCE TO RELATED APPLICATIONS

This application claims benefit of U.S. provisional patent application Ser. No. 62/839,186, filed Apr. 26, 2019, which is herein incorporated by reference.

BACKGROUND

Field

Embodiments of the present disclosure generally relate to deposition processes, and in particular to vapor deposition processes for depositing films on aerospace components.

Description of the Related Art

Turbine engines typically have components which corrode or degrade over time due to being exposed to hot gases and/or reactive chemicals (e.g., acids, bases, or salts). Such turbine components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These coatings are formed on the substrate in a number of different ways. For example, a nickel aluminide layer may be grown as an outer coat on a nickel base superalloy by simply exposing the substrate to an aluminum rich environment at elevated temperatures. The aluminum diffuses into the substrate and combines with the nickel to form an outer surface of the nickel-aluminum alloy.

A platinum modified nickel aluminide coating can be formed by first electroplating platinum to a predetermined thickness over the nickel-based substrate. Exposure of the platinum-plated substrate to an aluminum-rich environment at elevated temperatures causes the growth of an outer region of the nickel-aluminum alloy containing platinum in solid solution. In the presence of excess aluminum, the platinum-aluminum has two phases that may precipitate in the NiAl matrix as the aluminum diffuses into and reacts with the nickel and platinum.

However, as the increased demands for engine performance elevate the engine operating temperatures and/or the engine life requirements, improvements in the performance of coatings when used as environmental coatings or as bond coatings are needed over and above the capabilities of these existing coatings. Because of these demands, a coating that can be used for environmental protection or as a bond coat capable of withstanding higher operating temperatures or operating for a longer period of time before requiring removal for repair, or both, is desired. These known coating materials and deposition techniques have several shortcomings. Most metal alloy coatings deposited by low pressure plasma spray, plasma vapor deposition (PVD), electron beam PVD (EBPVD), cathodic arc, or similar sputtering techniques are line of sight coatings, meaning that interiors of components are not able to be coated. Platinum electroplating of exteriors typically forms a reasonably uniform coating, however, electroplating the interior of a component has proven to be challenging. The resulting electroplating coatings are often too thin to be protective or too thick that there are other adverse mechanical effects, such as high weight gain or fatigue life debit. Similarly, aluminide coatings suffer from non-uniformity on interior passages of components. Aluminide coatings are brittle, which can lead to reduced life when exposed to fatigue.

In addition, most of these coatings are on the order of greater than 10 micrometers in thickness, which can cause component weight to increase, making design of the disks and other support structures more challenging. It is desired by many to have coatings that (1) protect metals from oxidation and corrosion, (2) are capable of high film thickness and composition uniformity on arbitrary geometries, (3) have high adhesion to the metal, and/or (4) are sufficiently thin to not materially increase weight or reduce fatigue life outside of current design practices for bare metal.

Therefore, improved protective coatings and methods for depositing the protective coatings are needed.

SUMMARY

Embodiments of the present disclosure generally relate to protective coatings on an aerospace component and methods for depositing the protective coatings. In one or more embodiments, a method for depositing a coating on an aerospace component includes depositing one or more layers on a surface of the aerospace component using an atomic layer deposition or chemical vapor deposition process, and performing a partial oxidation and annealing process to convert the one or more layers to a coalesced layer having a preferred phase crystalline assembly. During oxidation cycles, an aluminum depleted region is formed at the surface of the aerospace component, and an aluminum oxide region is formed between the aluminum depleted region and the coalesced layer. The coalesced layer forms a protective coating, which decreases the rate of aluminum depletion from the aerospace component and the rate of new aluminum oxide scale formation.

In one embodiment, a method for depositing a coating on an aerospace component comprises exposing an aerospace component to a first precursor and a first reactant to form a first deposited layer on a surface of the aerospace component by a first atomic layer deposition process at a temperature between about 20 degrees Celsius to about 500 degrees Celsius, the aerospace component comprising nickel and aluminum. The first deposited layer forms a protective coating on the aerospace component. The protective coating protects the aerospace component from corrosion and oxidation and decreases a rate of depletion of aluminum from the aerospace component.

In another embodiment, a method for depositing a coating on an aerospace component comprises depositing a first deposited layer on a surface of an aerospace component by a chemical vapor deposition process, the aerospace component comprising nickel and aluminum, converting the first deposited layer to a crystalline phase, and forming an aluminum oxide region between the first deposited layer and the aerospace component, the aluminum oxide region having a crystalline assembly. The first deposited layer and the aluminum oxide region form a protective coating on the aerospace component. The protective coating protects the aerospace component from corrosion and oxidation and decreases a rate of depletion of aluminum from the aerospace component.

In yet another embodiment, a method for depositing a coating on an aerospace component comprises depositing a first deposited layer on a surface of an aerospace component by a chemical vapor deposition (CVD) process or an atomic layer deposition (ALD) process, the aerospace component comprising nickel and aluminum, performing a first annealing and oxidizing process to convert the first deposited layer into a preferred crystalline phase, depositing a second deposited layer by the CVD process or the ALD process on the first deposited layer, and performing a second annealing and oxidizing process to convert the second deposited layer into the preferred crystalline phase. The first deposited layer and the second deposited layer form a protective coating on the aerospace component. The protective coating protects the aerospace component from corrosion and oxidation and decreases a rate of depletion of aluminum from the aerospace component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to protective coatings on an aerospace component and methods for depositing the protective coatings. In one or more embodiments, a method for depositing a coating on an aerospace component includes depositing one or more layers on a surface of the aerospace component using an atomic layer deposition or chemical vapor deposition process, and performing a partial oxidation and annealing process to convert the one or more layers to a coalesced layer having a preferred phase crystalline assembly. During oxidation cycles, an aluminum depleted region is formed at the surface of the aerospace component, and an aluminum oxide region is formed between the aluminum depleted region and the coalesced layer. The coalesced layer forms a protective coating, which decreases the rate of aluminum depletion from the aerospace component and the rate of new aluminum oxide scale formation.

In one or more embodiments, a method for depositing a protective coating on an aerospace component includes sequentially exposing the aerospace component to a chromium precursor and a reactant to form a chromium-containing layer on a surface the aerospace component by an atomic layer deposition (ALD) process. The chromium-containing layer contains metallic chromium, chromium oxide, chromium nitride, chromium carbide, chromium silicide, or any combination thereof.

In some embodiments, a nanolaminate film stack or protective coating is formed on the surface of the aerospace component, where the nanolaminate film stack or protective coating contains alternating layers of the chromium-containing layer and a second deposited layer. The aerospace component can be sequentially exposed to a metal or silicon precursor and a second reactant to form the second deposited layer on the surface by ALD. The second deposited layer contains aluminum oxide, hafnium doped aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The nanolaminate film stack or protective coating containing the alternating layers of the chromium-containing layer and the second deposited layer can be used as the protective coating on the aerospace component. Alternatively, in other embodiments, the nanolaminate film stack or protective coating disposed on the aerospace component can be exposed to an annealing process to convert the nanolaminate film stack or protective coating into a coalesced film, which can be used as the protective coating on the aerospace component.

Figure 1:
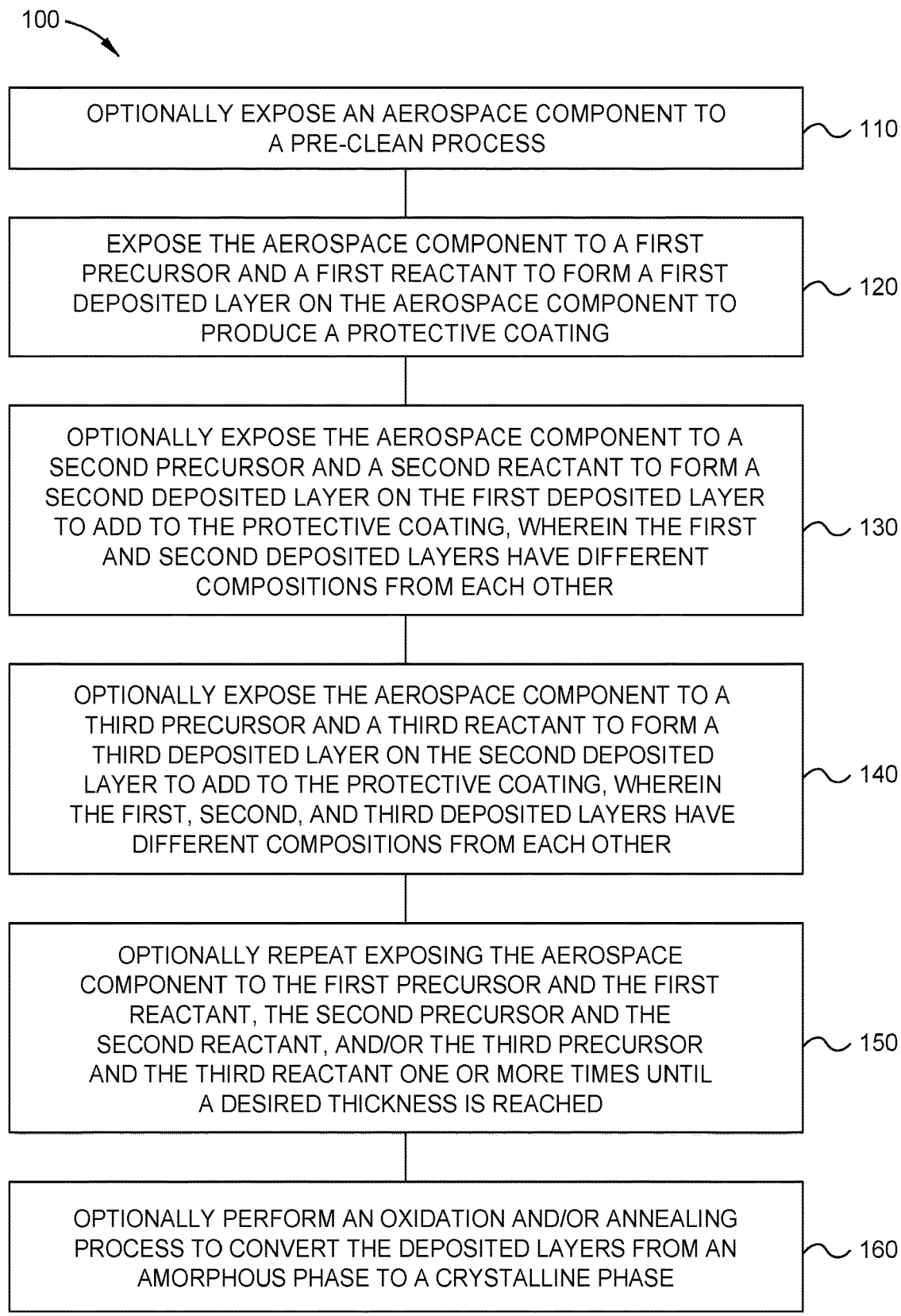
FIG. 1 is a flow chart of a method for depositing a coating on an aerospace component, according to one or more embodiments described and discussed herein.

FIG. 1 is a flow chart of a method 100 for depositing a coating on one or more aerospace components, according to one or more embodiments described and discussed herein. FIGS. 2A-2B, FIGS. 3A-3B, FIGS. 4A-4B, FIGS. 5A-5B, and FIGS. 6A-6B are various schematic examples of protective coatings disposed on a surface of the aerospace component, according to one or more embodiments described and discussed herein. The protective coatings of FIGS. 2A-6B can be deposited or otherwise formed on the aerospace component by the method 100 described and discussed below. Moreover, while FIGS. 2A-6B illustrate various embodiments, the embodiments depicted in each of FIGS. 2A-6B may be combined with one another. For description purposes, FIGS. 2A-6B will be described prior to the method 100.

Figure 2A:
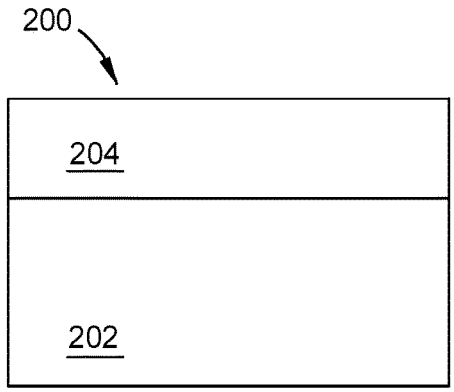
FIGS. 2A and 2B are schematic views of protective coatings disposed on a surface of an aerospace component, according to one embodiment.
Figure 2B:
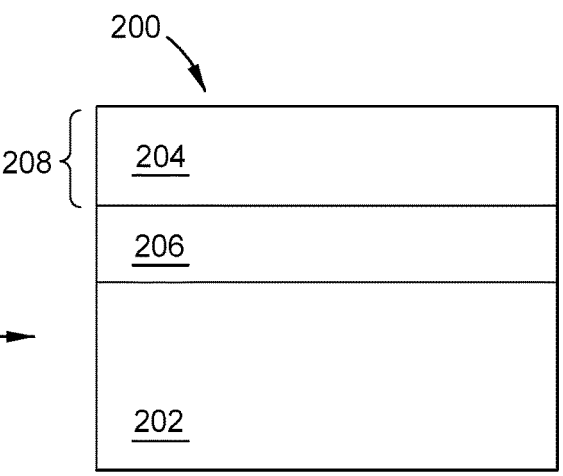

FIG. 2A illustrates a protective coating 200 deposited on an aerospace component 202. The aerospace component 202 comprises a nickel alloy comprising aluminum. The protective coating 200 comprises a first deposited layer 204 comprising aluminum, such as aluminum oxide ($Al_2O_3$). The first deposited layer 204 may be deposited in an amorphous or crystalline phase. FIG. 2B illustrates the protective coating 200 of FIG. 2A after an optional annealing and oxidation process. For example, the optional annealing and oxidation process may be performed when the first deposited layer 204 is deposited in the amorphous phase. The oxidizing process may partially oxidize the protective coating 200.

Following the optional annealing and oxidation process, the protective coating 200 comprises an intermediate region 206 disposed between the first deposited layer 204 and the aerospace component 202. The intermediate region 206 is an aluminum depleted region of the aerospace component 202, or a region depleted of an aluminum-rich phase. The intermediate region 206 may not be a distinct layer, but may instead be a topmost portion or region of the aerospace component 202. Aluminum from the aerospace component 202 diffuses into the first deposited layer 204, adding an additional amount of aluminum oxide (not shown) to the first deposited layer 204. The additional amount of aluminum oxide and the first deposited layer 204 form a coalesced layer 208 having a preferred crystalline assembly. Thus, after the annealing process of FIG. 2B, the first deposited layer 204 has a greater amount of aluminum oxide. The protective coating 200 protects the aerospace component 202 from corrosion and oxidation, and further decreases the rate of depletion of aluminum from the intermediate region 206. Performing the optional annealing and oxidizing process may further enhance and strengthen the protective properties of the protective coating 200.

Figure 3A:
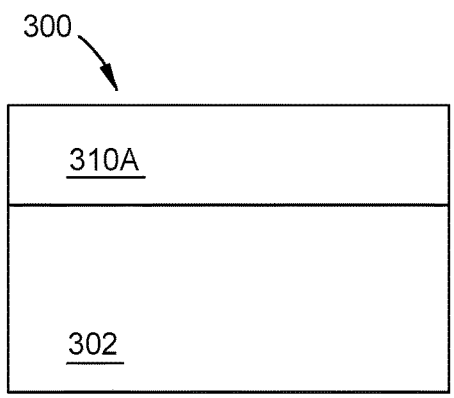
FIGS. 3A and 3B are schematic views of protective coatings disposed on a surface of an aerospace component, according to another embodiment.
Figure 3B:
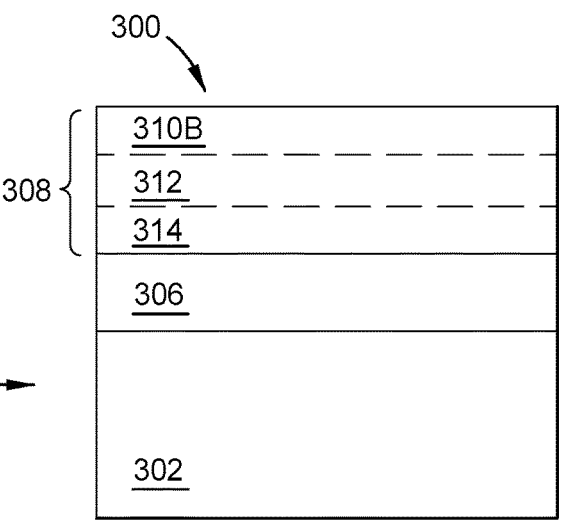

FIG. 3A illustrates a protective coating 300 or nanolaminate film stack deposited on an aerospace component 302. The aerospace component 302 comprises a nickel alloy comprising aluminum. The protective component 300 comprises a first deposited layer 310A comprising chromium, such as chromium oxide ($Cr_2O_3$). The first deposited layer 310A may be deposited in an amorphous phase or a crystalline phase. FIG. 3B illustrates the protective coating 300 of FIG. 3A after an optional annealing and oxidation process. For example, the optional annealing and oxidation process may be performed when the first deposited layer 310A is deposited in the amorphous phase. The oxidizing process may partially oxidize the protective coating 300. The protective coating 300 comprises a coalesced film or layer 308 formed during the annealing and oxidizing process, the coalesced layer 308 comprising a chromium oxide region 310B from the first deposited layer 310A. The coalesced layer 308 is in a preferred crystalline phase.

Following the annealing and oxidizing process, an intermediate region 306 is disposed between the coalesced layer 308 and the aerospace component 302. The intermediate region 306 is an aluminum depleted region of the aerospace component 302, or a region depleted of an aluminum-rich phase. The intermediate region 306 may not be a distinct layer, but may instead be a topmost portion or region of the aerospace component 302. Aluminum from the aerospace component 302 diffuses into the coalesced layer 308, forming a thin region 314 of aluminum oxide in the coalesced layer 308 above the intermediate region 306. The coalesced layer 308 further comprises a mixed chromium-aluminum region 312, such as chromium-aluminum oxide (($Al, Cr)_2O_3$), disposed between the aluminum oxide region 310 and the chromium oxide region 310B, each region being in a crystalline phase. While the regions 310B, 312, 314 of the coalesced layer 308 are shown as distinct regions or layers, the coalesced layer 308 is one, substantially continuous layer comprising each of the elements of the regions 310B, 312, 314 (i.e., aluminum oxide, chromium oxide, and mixed chromium-aluminum oxide). The protective coating 300 protects the aerospace component 302 from corrosion and oxidation, and further decreases the rate of depletion of aluminum from the intermediate region 306. Performing the optional annealing and oxidizing process may further enhance and strengthen the protective properties of the protective coating 300.

Figure 4A:
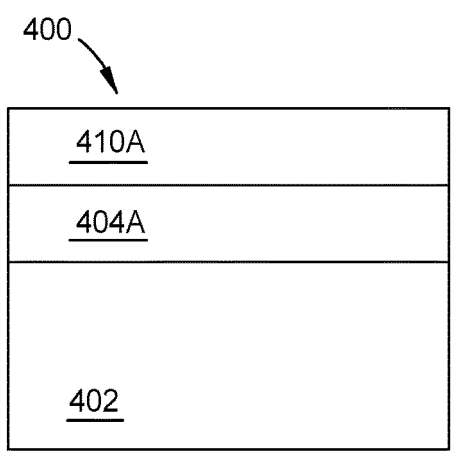
FIGS. 4A and 4B are schematic views of protective coatings disposed on a surface of an aerospace component, according to yet another embodiment.
Figure 4B:
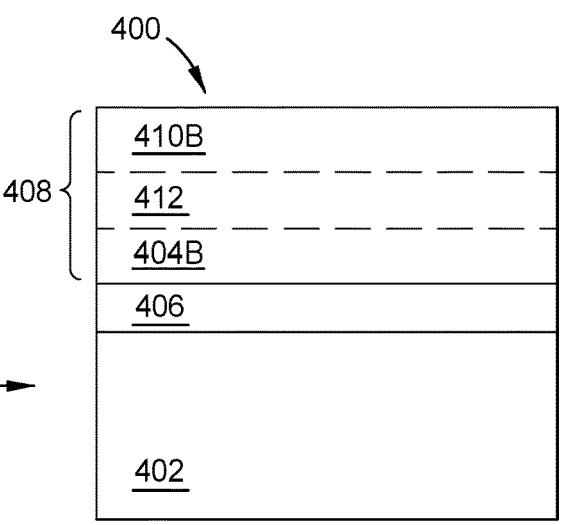

FIG. 4A illustrates a protective coating 400 or nanolaminate film stack deposited on an aerospace component 402. The aerospace component 402 comprises a nickel alloy comprising aluminum. The protective component 400 comprises a first deposited layer 404A comprising aluminum, such as aluminum oxide, and a second deposited layer 410A comprising chromium, such as chromium oxide, disposed on the first deposited layer 404A. The first deposited layer 404A and the second deposited layer 410A may each be deposited in an amorphous phase or a crystalline phase. FIG. 4B illustrates the protective coating 400 of FIG. 4A after an optional annealing and oxidation process. For example, the optional annealing and oxidation process may be performed when the first deposited layer 404A and/or the second deposited layer 410A are deposited in the amorphous phase. The oxidizing process may partially oxidize the protective coating 400. The protective coating 400 includes a coalesced film or layer 408 formed during the annealing and oxidizing process, the coalesced layer 408 comprising an aluminum oxide region 404B from the first deposited layer 404A and a chromium oxide region 410B from the second deposited layer 410A. The coalesced layer 408 is in a preferred crystalline phase.

In one embodiment, the first deposited layer 404A may be deposited, and then annealed and oxidized to convert the first deposited layer 404A to the preferred crystalline phase. The second deposited layer 410A may then be deposited on the first deposited layer 404A, and then annealed and oxidized to convert the second deposited layer 410A to the preferred crystalline phase.

Following the annealing and oxidizing process, an intermediate region 406 is disposed between the coalesced layer 408 and the aerospace component 402. The intermediate region 406 is an aluminum depleted region of the aerospace component 402, or a region depleted of an aluminum-rich phase. The intermediate region 406 may not be a distinct layer, but may instead be a topmost portion or region of the aerospace component 402. Aluminum from the aerospace component 402 diffuses into the coalesced layer 408, adding an additional amount of aluminum oxide to the aluminum oxide region 404B of the coalesced layer 408 above the intermediate region 406. The coalesced layer 408 further comprises a mixed chromium-aluminum region 412, such as chromium-aluminum oxide, disposed between the aluminum oxide region 404B and the chromium oxide region 410B, each region being in a crystalline phase. While the regions 404B, 412, 410B of the coalesced layer 408 are shown as distinct regions or layers, the coalesced layer 408 is one, substantially continuous layer comprising each of the elements of the regions 404B, 412, 410B (i.e., aluminum oxide, chromium oxide, and mixed chromium-aluminum oxide). The protective coating 400 protects the aerospace component 402 from corrosion and oxidation, and further decreases the rate of depletion of aluminum from the intermediate region 406. Performing the optional annealing and oxidizing process may further enhance and strengthen the protective properties of the protective coating 400.

Figure 5A:
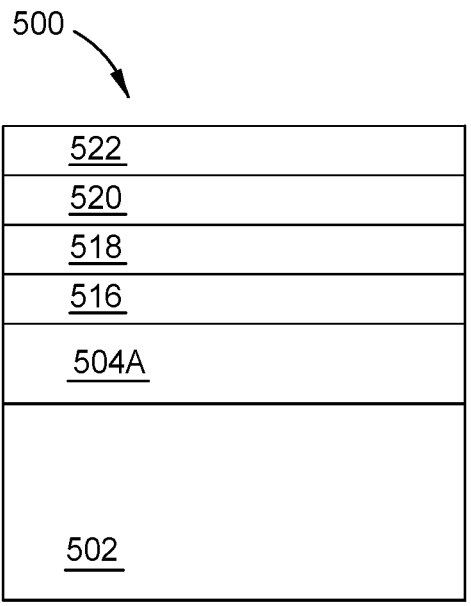
FIGS. 5A and 5B are schematic views of protective coatings disposed on a surface of an aerospace component, according to another embodiment.

FIG. 5A illustrates a protective coating 500 or nanolaminate film stack deposited on an aerospace component 502. The aerospace component 502 comprises a nickel alloy comprising aluminum. The protective component 500 comprises a first deposited layer 504A comprising aluminum (e.g., aluminum oxide), a second deposited layer 516 comprising chromium (e.g., chromium oxide) disposed on the first deposited layer 504A, a third deposited layer 518 comprising aluminum (e.g., aluminum oxide) disposed on the second deposited layer 516, a fourth deposited layer 520 comprising chromium (e.g., chromium oxide) disposed on the third deposited layer 518, and a fifth deposited layer 522 comprising aluminum (e.g., aluminum oxide) disposed on the fourth deposited layer 520. Each of the deposited layers 504A, 516, 518, 520, 522 may be deposited in an amorphous phase or a crystalline phase. The first deposited layer 504A may have a greater thickness than each of the second through fifth deposited layers 516-522. The second through fifth deposited layers 516-522 may have about the same thickness. While five deposited layers are shown, any number of layers may be utilized.

Figure 5B:
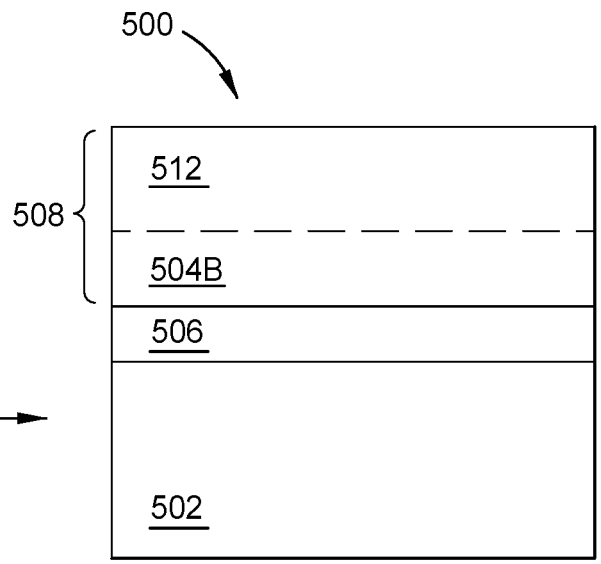

FIG. 5B illustrates the protective component 500 of FIG. 5A after an optional annealing and oxidation process. For example, the optional annealing and oxidation process may be performed when one or more of the deposited layers 504A, 516, 518, 520, 522 are deposited in the amorphous phase. The oxidizing process may partially oxidize the protective coating 500. In one embodiment, the first deposited layer 504A may be deposited, and then annealed and oxidized to convert the first deposited layer 504A to the preferred crystalline phase. The second deposited layer 516 may then be deposited on the first deposited layer 504A, and then annealed and oxidized to convert the second deposited layer 516 to the preferred crystalline phase. The third deposited layer 518 may then be deposited on the second deposited layer 516, and then annealed and oxidized to convert the third deposited layer 518 to the preferred crystalline phase. The fourth deposited layer 520 may then be deposited on the third deposited layer 518, and then annealed and oxidized to convert the fourth deposited layer 520 to the preferred crystalline phase. The fifth deposited layer 522 may then be deposited on the fourth deposited layer 520, and then annealed and oxidized to convert the fifth deposited layer 522 to the preferred crystalline phase.

The protective coating 500 comprises a coalesced film or layer 508 formed during the annealing and oxidizing process, the coalesced layer 508 comprising an aluminum oxide region 504B from the first deposited layer 504A and a mixed chromium-aluminum region 512, such as chromium-aluminum oxide. The coalesced layer 508 is in a preferred crystalline phase. An intermediate region 506 is disposed between the coalesced layer 508 and the aerospace component 502. The intermediate region 506 is an aluminum depleted region of the aerospace component 502, or a region depleted of an aluminum-rich phase. The intermediate region 506 may not be a distinct layer, but may instead be a topmost portion or region of the aerospace component 502. Aluminum from the aerospace component 502 diffuses into the coalesced layer 508, adding an additional amount of aluminum oxide to the aluminum oxide region 504B of the coalesced layer 508 above the intermediate region 506. While the regions 504B and 512 of the coalesced layer 508 are shown as distinct regions or layers, the coalesced layer 508 is one, substantially continuous layer comprising each of the elements of the regions 504B, 512 (i.e., aluminum oxide, and mixed chromium-aluminum oxide). The protective coating 500 protects the aerospace component 502 from corrosion and oxidation, and further decreases the rate of depletion of aluminum from the intermediate region 506. Performing the optional annealing and oxidizing process may further enhance and strengthen the protective properties of the protective coating 500.

Figure 6A:
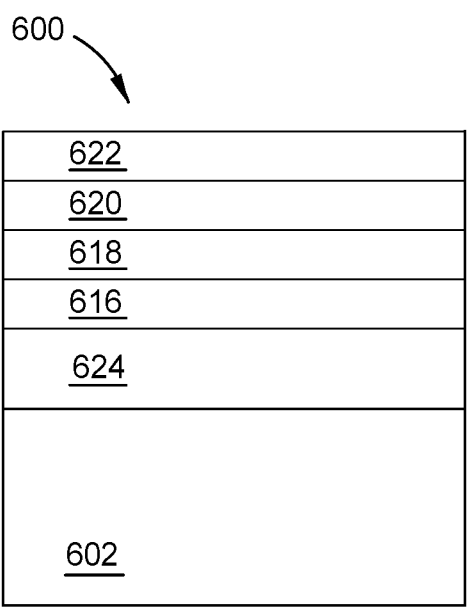
FIGS. 6A and 6B are schematic views of protective coatings disposed on a surface of an aerospace component, according to yet another embodiment.

FIG. 6A illustrates a protective coating 600 or nanolaminate film stack deposited on an aerospace component 602. The aerospace component 602 comprises a nickel alloy comprising aluminum. The protective component 600 comprises a first deposited layer 624 comprising hafnium (e.g., hafnium doped aluminum oxide), a second deposited layer 616 comprising chromium (e.g., chromium oxide) disposed on the first deposited layer 624, a third deposited layer 618 comprising aluminum (e.g., aluminum oxide) disposed on the second deposited layer 616, a fourth deposited layer 620 comprising chromium (e.g., chromium oxide) disposed on the third deposited layer 618, and a fifth deposited layer 622 comprising aluminum (e.g., aluminum oxide) disposed on the fourth deposited layer 620. Each of the deposited layers 624, 616, 618, 620, 622 may be deposited in an amorphous phase or a crystalline phase. The first deposited layer 624 may have a greater thickness than each of the second through fifth deposited layers 616-622. The second through fifth deposited layers 616-622 may have about the same thickness. While five deposited layers are shown, any number of layers may be utilized.

Figure 6B:
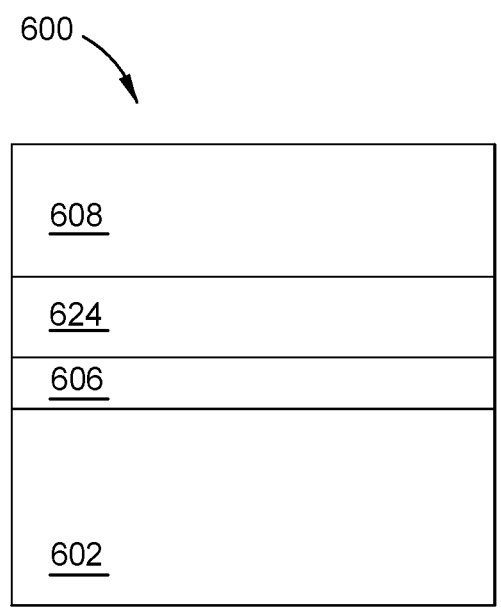

FIG. 6B illustrates the protective coating 600 of FIG. 6A after an optional annealing and oxidation process. For example, the optional annealing and oxidation process may be performed when one or more of the deposited layers 624, 616, 618, 620, 622 are deposited in the amorphous phase. The oxidizing process may partially oxidize the protective coating 600. In one embodiment, the first deposited layer 624 may be deposited, and then annealed and oxidized to convert the first deposited layer 624 to the preferred crystalline phase. The second deposited layer 616 may then be deposited on the first deposited layer 624, and then annealed and oxidized to convert the second deposited layer 616 to the preferred crystalline phase. The third deposited layer 618 may then be deposited on the second deposited layer 616, and then annealed and oxidized to convert the third deposited layer 618 to the preferred crystalline phase. The fourth deposited layer 620 may then be deposited on the third deposited layer 618, and then annealed and oxidized to convert the fourth deposited layer 620 to the preferred crystalline phase. The fifth deposited layer 622 may then be deposited on the fourth deposited layer 620, and then annealed and oxidized to convert the fifth deposited layer 622 to the preferred crystalline phase.

The protective coating 600 comprises a coalesced film or layer 608 formed during the annealing and oxidizing process disposed on the first deposited layer 624, the coalesced layer 608 comprising a mixed chromium-aluminum compound, such as chromium-aluminum oxide. The coalesced layer 608 is in a preferred crystalline phase. An intermediate region 606 is disposed between the coalesced layer 608 and the aerospace component 602. The intermediate region 606 is an aluminum depleted region of the aerospace component 602, or a region depleted of an aluminum-rich phase. The intermediate region 606 may not be a distinct layer, but may instead be a topmost portion or region of the aerospace component 602. Aluminum from the aerospace component 602 diffuses into the first deposited layer 624, adding an additional amount of aluminum oxide to the first deposited layer 624 above the intermediate region 606. The protective coating 600 protects the aerospace component 602 from corrosion and oxidation, and further decreases the rate of depletion of aluminum from the intermediate region 606. Performing the optional annealing and oxidizing process may further enhance and strengthen the protective properties of the protective coating 600.

At block 110, prior to producing a protective coating 200, 300, 400, 500, 600, the aerospace component 202, 302, 402, 502, 602 can optionally be exposed to one or more pre-clean processes. The surfaces of the aerospace component 202, 302, 402, 502, 602 can contain oxides, organics, oil, soil, particulate, debris, and/or other contaminants that may be removed prior to producing the protective coating 200, 300, 400, 500, 600 on the aerospace component 202, 302, 402, 502, 602. The pre-clean process can be or include one or more basting or texturing processes, vacuum purges, solvent clean, acid clean, wet clean, plasma clean, sonication, or any combination thereof. Once cleaned and/or textured, the subsequently deposited protective coating 200, 300, 400, 500, 600 has stronger adhesion to the surfaces of the aerospace component 202, 302, 402, 502, 602 than if otherwise not exposed to the pre-clean process.

In one or more examples, the surfaces of the aerospace component 202, 302, 402, 502, 602 can be blasted with or otherwise exposed to beads, sand, carbonate, or other particulates to remove oxides and other contaminates therefrom and/or to provide texturing to the surfaces of the aerospace component 202, 302, 402, 502, 602. In some examples, the aerospace component 202, 302, 402, 502, 602 can be placed into a chamber within a pulsed push-pull system and exposed to cycles of purge gas (e.g., $N_2$, Ar, He, or any combination thereof) and vacuum purges to remove debris from small holes on the aerospace component 202, 302, 402, 502, 602. In other examples, the surfaces of the aerospace component 202, 302, 402, 502, 602 can be exposed to hydrogen plasma, oxygen or ozone plasma, and/or nitrogen plasma, which can be generated in a plasma chamber or by a remote plasma system.

In one or more examples, such as for organic removal or oxide removal, the surfaces of the aerospace component 202, 302, 402, 502, 602 can be exposed to a hydrogen plasma, then degassed, then exposed to ozone treatment. In other examples, such as for organic removal, the surfaces of the aerospace component 202, 302, 402, 502, 602 can be exposed to a wet clean that includes: soaking in an alkaline degreasing solution, rinsing, exposing the surfaces to an acid clean (e.g., sulfuric acid, phosphoric acid, or hydrochloric acid), rinsing, and exposing the surfaces deionized water sonication bath. In some examples, such as for oxide removal, the surfaces of the aerospace component 202, 302, 402, 502, 602 can be exposed to a wet clean that includes: exposing the surfaces to a dilute acid solution (e.g., acetic acid or hydrochloric acid), rinsing, and exposing the surfaces deionized water sonication bath. In one or more examples, such as for particle removal, the surfaces of the aerospace component 202, 302, 402, 502, 602 can be exposed to sonication (e.g., megasonication) and/or a supercritical carbon dioxide wash, followed by exposing to cycles of purge gas (e.g., $N_2$, Ar, He, or any combination thereof) and vacuum purges to remove particles from and dry the surfaces. In some examples, the aerospace component 202, 302, 402, 502, 602 can be exposed to heating or drying processes, such as heating the aerospace component 202, 302, 402, 502, 602 to a temperature of about 50° C., about 65° C., or about 80° C. to about 100° C., about 120° C., or about 150° C. and exposing to surfaces to the purge gas. The aerospace component 202, 302, 402, 502, 602 can be heated in an oven or exposed to lamps for the heating or drying processes.

At block 120, the aerospace component 202, 302, 402, 502, or 602 is exposed to a first precursor and a first reactant to form the first deposited layer 204, 310A, 404A, 504A, or 624 on the aerospace component 202, 302, 402, 502, 602 by a vapor deposition process, as depicted in FIGS. 2A, 3A, 4A, 5A, and 6A, respectively, to form a protective coating 200, 300, 400, 500, 600. The vapor deposition process can be an ALD process, a plasma-enhanced ALD (PE-ALD) process, a thermal chemical vapor deposition (CVD) process, a plasma-enhanced CVD (PE-CVD) process, a low pressure CVD process, or any combination thereof.

In one or more embodiments, the vapor deposition process is an ALD process and the method includes sequentially exposing the surface of the aerospace component 202, 302, 402, 502, or 602 to the first precursor and the first reactant to form the first deposited layer 204, 310A, 404A, 504A, or 624. Each cycle of the ALD process includes exposing the surface of the aerospace component to the first precursor, conducting a pump-purge, exposing the aerospace component to the first reactant, and conducting a pump-purge to form the first deposited layer 204, 310A, 404A, 504A, or 624. The order of the first precursor and the first reactant can be reversed, such that the ALD cycle includes exposing the surface of the aerospace component to the first reactant, conducting a pump-purge, exposing the aerospace component to the first precursor, and conducting a pump-purge to form the first deposited layer 204, 310A, 404A, 504A, or 624.

In some examples, during each ALD cycle, the aerospace component 202, 302, 402, 502, 602 is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the aerospace component 202, 302, 402, 502, 602 is exposed to the first precursor for about 0.5 seconds to about 3 seconds, the first reactant for about 0.5 seconds to about 3 seconds, and the pump-purge for about 1 second to about 10 seconds. The ALD process may be performed at a temperature of about 20° C. to about 500° C., such as about 300° C.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the first deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the first deposited layer 204, 310A, 404A, 504A, or 624.

In other embodiments, the vapor deposition process is a CVD process and the method includes simultaneously exposing the aerospace component 202, 302, 402, 502, or 602 to the first precursor and the first reactant to form the first deposited layer 204, 310A, 404A, 504A, 624. The CVD process may be performed at a temperature of about 300° C. to about 1200° C. The CVD process may be performed at a higher temperature than the ALD process. For example, the ALD process may be performed at a temperature of about 500° C. and the CVD process may be performed at a temperature of about 1100° C. The CVD process may be a PECVD process performed at a temperature of about 300° C. to about 1100° C., a low pressure CVD process performed at a temperature of about 500° C. to about 1100° C., or a thermal CVD process performed at a temperature of about 500° C. to about 1100° C. Depositing the first deposited layer 204, 310A, 404A, 504A, 624 by a CVD process may convert the first deposited layer 204, 310A, 404A, 504A, 624 to a crystalline phase. As such, the protective coating 200, 300, 400, 500, 600 may not need to undergo the annealing and oxidation process. However, the first deposited layer 204, 310A, 404A, 504A, 624 deposited through a CVD process may need to undergo the annealing and oxidation process to convert the first deposited layer 204, 310A, 404A, 504A, 624 to the preferred crystalline assembly.

During an ALD process or a CVD process, each of the first precursor and the first reactant can independent include one or more carrier gases. One or more purge gases can be flowed across the aerospace component and/or throughout the processing chamber in between the exposures of the first precursor and the first reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The first deposited layer 204, 310A, 404A, 504A, or 624 can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the first deposited layer 204, 310A, 404A, 504A, or 624 can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In one or more embodiments, the first precursor contains one or more chromium precursors, such as in FIG. 3A, one or more aluminum precursors, such as in FIGS. 2A, 4A, and 5A, or one or more hafnium precursors, such as in FIG. 6A. The first reactant contains one or more reducing agents, one or more oxidizing agents, one or more nitriding agents, one or more silicon precursors, one or more carbon precursors, or any combination thereof. In some examples, such as FIG. 3A, the first deposited layer 310A is a chromium-containing layer which can be or include metallic chromium, chromium oxide, chromium nitride, chromium silicide, chromium carbide, or any combination thereof. In other examples, such as FIGS. 2A, 4A, 5A, and 6A, the first deposited layer 204, 404A, 504A, or 624 is an aluminum-containing layer which can be or include metallic aluminum, aluminum oxide, aluminum nitride, aluminum silicide, aluminum carbide, or any combination thereof. In further examples, such as FIG. 6A, the first deposited layer 624 is a hafnium-containing layer which can be or include hafnium doped aluminum oxide, metallic hafnium, hafnium oxide, hafnium nitride, hafnium silicide, hafnium carbide, or any combination thereof.

The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isoproplycyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4-pentanediono) chromium), chromium hexafluoroacetylacetonate ($Cr(hfac)_3$), chromium(III) tris(2,2,6,6-tetramethyl-3,5-heptanedionate) $\{Cr(tmhd)_3\}$, chromium(II) bis(1,4-ditertbutyldiazadienyl), isomers thereof, complexes thereof, abducts thereof, salts thereof, or any combination thereof. Exemplary chromium diazadienyl compounds can have a chemical formula of:

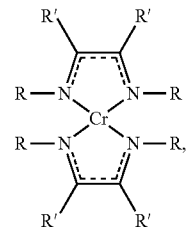

where each R and R' is independently selected from H, C1-C6 alkyl, aryl, acyl, alkylamido, hydrazido, silyl, aldehyde, keto, C2-C4 alkenyl, alkynyl, or substitutes thereof. In some examples, each R is independently a C1-C6 alkyl which is selected from methyl, ethyl, propyl, butyl, or isomers thereof, and R' is H. For example, R is metyl and R' is H, R is ethyl and R' is H, R is iso-propyl and R' is H, or R is tert-butyl and R' is H.

The aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof.

Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate ($Al(acac)_3$, also known as, tris(2,4-pentanediono) aluminum), aluminum hexafluoroacetylacetonate ($Al(hfac)_3$), trisdipivaloylmethanatoaluminum ($DPM_3Al$; $(C_{11}H_{19}O_2)_3Al$), isomers thereof, complexes thereof, abducts thereof, salts thereof, or any combination thereof.

The hafnium precursor can be or include one or more of hafnium cyclopentadiene compounds, one or more of hafnium amino compounds, one or more of hafnium alkyl compounds, one or more of hafnium alkoxy compounds, substitutes thereof, complexes thereof, abducts thereof, salts thereof, or any combination thereof. Exemplary hafnium precursors can be or include bis(methylcyclopentadiene) dimethylhafnium (($MeCp)_2HfMe_2$), bis(methylcyclopentadiene) methylmethoxyhafnium (($MeCp)_2Hf(OMe)(Me)$), bis(cyclopentadiene) dimethylhafnium (($Cp)_2HfMe_2$), tetra (tert-butoxy) hafnium, hafniumum isopropoxide (($iPrO)_4Hf$), tetrakis(dimethylamino) hafnium (TDMAH), tetrakis (diethylamino) hafnium (TDEAH), tetrakis (ethylmethylamino) hafnium (TEMAH), isomers thereof, complexes thereof, abducts thereof, salts thereof, or any combination thereof.

The titanium precursor can be or include one or more of titanium cyclopentadiene compounds, one or more of titanium amino compounds, one or more of titanium alkyl compounds, one or more of titanium alkoxy compounds, substitutes thereof, complexes thereof, abducts thereof, salts thereof, or any combination thereof. Exemplary titanium precursors can be or include bis(methylcyclopentadiene) dimethyltitanium (($MeCp)_2TiMe_2$), bis(methylcyclopentadiene) methylmethoxytitanium (($MeCp)_2Ti(OMe)(Me)$), bis(cyclopentadiene) dimethyltitanium (($Cp)_2TiMe_2$), tetra (tert-butoxy) titanium, titaniumum isopropoxide (($iPrO)_4Ti$), tetrakis(dimethylamino) titanium (TDMAT), tetrakis (diethylamino) titanium (TDEAT), tetrakis (ethylmethylamino) titanium (TEMAT), isomers thereof, complexes thereof, abducts thereof, salts thereof, or any combination thereof.

In one or more examples, the first deposited layer 310A is a chromium-containing layer which can be or include metallic chromium and the first reactant contains one or more reducing agents. In some examples, the first deposited layer 204, 404A, 504A, or 624 is an aluminum-containing layer which can be or include metallic aluminum and the first reactant contains one or more reducing agents. In other examples, the first deposited layer 624 is a hafnium-containing layer which can be or include metallic hafnium and the first reactant contains one or more reducing agents. Exemplary reducing agents can be or include hydrogen ($H_2$), ammonia, hydrazine, one or more hydrazine compounds, one or more alcohols, a cyclohexadiene, a dihydropyrazine, an aluminum containing compound, abducts thereof, salts thereof, plasma derivatives thereof, or any combination thereof.

In some examples, the first deposited layer 310A is a chromium-containing layer which can be or include chromium oxide and the first reactant contains one or more oxidizing agents. In other examples, the first deposited layer 204, 404A, 504A, or 624 is an aluminum-containing layer which can be or include aluminum oxide and the first reactant contains one or more oxidizing agents. In further examples, the first deposited layer 624 is a hafnium-containing layer which can be or include hafnium oxide and the first reactant contains one or more oxidizing agents. Exemplary oxidizing agents can be or include water (e.g., steam), oxygen ($O_2$), atomic oxygen, ozone, nitrous oxide, one or more peroxides, one or more alcohols, plasmas thereof, or any combination thereof.

In one or more examples, the first deposited layer 310A is a chromium-containing layer which can be or include chromium nitride and the first reactant contains one or more nitriding agents. In other examples, the first deposited layer 204, 404A, 504A, or 624 is an aluminum-containing layer which can be or include aluminum nitride and the first reactant contains one or more nitriding agents. In some examples, the first deposited layer 624 is a hafnium-containing layer which can be or include hafnium nitride and the first reactant contains one or more nitriding agents. Exemplary nitriding agents can be or include ammonia, atomic nitrogen, one or more hydrazines, nitric oxide, plasmas thereof, or any combination thereof.

In one or more examples, the first deposited layer 310A is a chromium-containing layer which can be or include chromium silicide and the first reactant contains one or more silicon precursors. In some examples, the first deposited layer 204, 404A, 504A, or 624 is an aluminum-containing layer which can be or include aluminum silicide and the first reactant contains one or more silicon precursors. In other examples, the first deposited layer 624 is a hafnium-containing layer which can be or include hafnium silicide and the first reactant contains one or more silicon precursors. Exemplary silicon precursors can be or include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof.

In some examples, the first deposited layer 310A is a chromium-containing layer which can be or include chromium carbide and the first reactant contains one or more carbon precursors. In other examples, the first deposited layer 204, 404A, 504A, or 624 is an aluminum-containing layer which can be or include aluminum carbide and the first reactant contains one or more carbon precursors. In further examples, the first deposited layer 624 is a hafnium-containing layer which can be or include hafnium carbide and the first reactant contains one or more carbon precursors. Exemplary carbon precursors can be or include one or more alkanes, one or more alkenes, one or more alkynes, substitutes thereof, plasmas thereof, or any combination thereof.

At block 130, the aerospace component 402, 502, 602 is optionally exposed to a second precursor and a second reactant to form the second deposited layer 410A, 516, or 616 on the first deposited layer 404A, 504A, or 624 to add to the protective coating 400, 500, 600, as shown in FIGS. 4A, 5A, and 6A. The first deposited layer 404A, 504A, or 624 or FIGS. 4A, 5A, and 6A and second deposited layer 410A, 516, 616 or FIGS. 4A, 5A, and 6A, respectively, have different compositions from each other. In some examples, the first precursor is a different precursor than the second precursor, such as that the first precursor is a source of a first type of metal and the second precursor is a source of a second type of metal and the first and second types of metal are different. While FIG. 2A and FIG. 3A are not shown with a second deposited layer, the protective coatings 200, 300 may include one or more second deposited layers having a different composition than the first deposited layers 204, 310A.

In one or more embodiments, the second precursor is or includes one or more aluminum precursors or one or more chromium precursors; however, the second precursor can be or include one or more aluminum precursors, one or more chromium precursors, one or more hafnium precursors, one or more yttrium precursors, or any combination thereof. The second reactant can be any other reactants used as the first reactant. For example, the second reactant can be or include one or more reducing agents, one or more oxidizing agents, one or more nitriding agents, one or more silicon precursors, one or more carbon precursors, or any combination thereof, as described and discussed above. During the ALD process, each of the second precursor and the second reactant can independent include one or more carrier gases. One or more purge gases can be flowed across the aerospace component and/or throughout the processing chamber in between the exposures of the second precursor and the second reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In one or more embodiments, the second deposited layer 410A, 516, 616 contains chromium oxide or aluminum oxide; however, the second deposited layer 410A, 516, 616 may contain aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. In one or more examples, if the first deposited layer 204, 310A, 404A, 504A, or 624 contains aluminum oxide or aluminum nitride, then the second deposited layer 410A, 516, 616 does not contain aluminum oxide or aluminum nitride. Similarly, if the first deposited layer 204, 310A, 404A, 504A, or 624 contains chromium oxide or chromium nitride, then the second deposited layer 410A, 516, 616 does not contain chromium oxide or chromium nitride. If the first deposited layer 204, 310A, 404A, 504A, or 624 contains hafnium oxide or hafnium nitride, then the second deposited layer 410A, 516, 616 does not contain hafnium oxide or hafnium nitride.

Each cycle of the ALD process includes exposing the aerospace component to the second precursor, conducting a pump-purge, exposing the aerospace component to the second reactant, and conducting a pump-purge to form the second deposited layer 410A, 516, 616. The order of the second precursor and the second reactant can be reversed, such that the ALD cycle includes exposing the surface of the aerospace component to the second reactant, conducting a pump-purge, exposing the aerospace component to the second precursor, and conducting a pump-purge to form the second deposited layer 410A, 516, 616.

In one or more examples, during each ALD cycle, the aerospace component 402, 502, 602 is exposed to the second precursor for about 0.1 seconds to about 10 seconds, the second reactant for about 0.1 seconds to about 10 seconds, and the pump-purge for about 0.5 seconds to about 30 seconds. In other examples, during each ALD cycle, the aerospace component 402, 502, 602 is exposed to the second precursor for about 0.5 seconds to about 3 seconds, the second reactant for about 0.5 seconds to about 3 seconds, and the pump-purge for about 1 second to about 10 seconds. The ALD process may be performed at a temperature of about 20° C. to about 500° C., such as about 300° C.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the second deposited layer 410A, 516, 616. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the second deposited layer 410A, 516, 616.

The second deposited layer 410A, 516, 616 can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the second deposited layer 410A, 516, 616 can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In some examples, such as FIG. 4A, the first deposited layer 410A is a chromium-containing layer that contains chromium oxide, chromium nitride, or a combination thereof, and the second deposited layer 410A contains one or more of aluminum oxide, silicon nitride, hafnium oxide, hafnium silicate, titanium oxide, or any combination thereof.

The second deposited layer 410A, 516, 616 may be deposited using a CVD process. The CVD process may be performed at a temperature of about 300° C. to about 1200° C. The CVD process may be performed at a higher temperature than the ALD process. For example, the ALD process may be performed at a temperature of about 500° C. and the CVD process may be performed at a temperature of about 1100° C. The CVD process may be a PECVD process performed at a temperature of about 300° C. to about 1100° C., a low pressure CVD process performed at a temperature of about 500° C. to about 1100° C., or a thermal CVD process performed at a temperature of about 500° C. to about 1100° C. Depositing the second deposited layer 410A, 516, 616 by a CVD process may convert the second deposited layer 410A, 516, 616 to a crystalline phase. As such, the protective coating 200, 300, 400, 500, 600 may not need to undergo the annealing and oxidation process. However, the second deposited layer 410A, 516, 616 deposited through a CVD process may need to undergo the annealing and oxidation process to convert the second deposited layer 410A, 516, 616 to the preferred crystalline assembly.

At block 140, the aerospace component 602 is optionally exposed to a third precursor and a third reactant to form the third deposited layer 618 on the second deposited layer 616 to add to the protective coating 600, such as shown in FIG. 6A. The first deposited layer 624, the second deposited layer 616, and the third deposited layer 618 each have different compositions from each other. In some examples, the third precursor is a different precursor than the first and second precursors. The third deposited layer 618 may have the same thickness as the second deposited layer 616. Additionally, the third deposited layer 618 may be formed in the same process or manner as the second deposited layer 616, including deposition method, time, and cycles. As such, all parameters discussed at block 130 apply to block 140.

In one or more embodiments, the third precursor is or includes one or more aluminum precursors; however, the third precursor can be or include one or more aluminum precursors, one or more chromium precursors, one or more hafnium precursors, one or more yttrium precursors, or any combination thereof. In some examples, such as FIG. 6A, the first deposited layer 624 is a hafnium doped aluminum oxide, the second deposited layer 616 is a chromium-containing layer that contains chromium oxide, and the third deposited layer 618 is an aluminum-containing layer that contains one or more of aluminum oxide.

At block 150, the method 100 includes optionally repeating exposing the aerospace component 502, 602 to the first precursor and the first reactant, the second precursor and the second reactant, and/or the third precursor and the third reactant one or more times until a desired thickness is reached or achieved, such as shown in FIGS. 5A and 6A. If the desired thickness of the protective coating 200, 300, 400 has been achieved, then move to block 160. If the desired thickness of the protective coating 500, 600 has not been achieved, then start another deposition cycle of exposing the aerospace component 502 to the first precursor and the first reactant to form a third deposited layer 518, exposing the aerospace component 502 to the second precursor and the second reactant to form a fourth deposited layer 520, and exposing the aerospace component 502 to the first precursor and the first reactant to form a fifth deposited layer 522 like shown in FIG. 5A, or by exposing the aerospace component 602 to the second precursor and the second reactant to form a fourth deposited layer 620 and exposing the aerospace component 602 to the third precursor and the third reactant to form a fifth deposited layer 622, like shown in FIG. 6A.

The deposition cycle is repeated until achieving the desired thickness of the protective coating 500, 600.

In one or more embodiments, the protective coating 500, 600 can contain from 1, 2, 3, 4, 5, 6, 7, 8, or 9 pairs of the first and second deposited layers (e.g., 504A and 516, 518 and 520) or the second and third deposited layers (e.g., 616 and 618, 620 and 622) to about 10, about 12, about 15, about 20, about 25, about 30, about 40, about 50, about 65, about 80, about 100, about 120, about 150, about 200, about 250, about 300, about 500, about 800, or about 1,000 pairs of the first and second deposited layers 504A, 516 or the second and third deposited layers 616, 618. For example, the protective coating 500, 600 can contain from 1 to about 1,000, 1 to about 800, 1 to about 500, 1 to about 300, 1 to about 250, 1 to about 200, 1 to about 150, 1 to about 120, 1 to about 100, 1 to about 80, 1 to about 65, 1 to about 50, 1 to about 30, 1 to about 20, 1 to about 15, 1 to about 10, 1 to about 8, 1 to about 6, 1 to 5, 1 to 4, 1 to 3, about 5 to about 150, about 5 to about 120, about 5 to about 100, about 5 to about 80, about 5 to about 65, about 5 to about 50, about 5 to about 30, about 5 to about 20, about 5 to about 15, about 5 to about 10, about 5 to about 8, about 5 to about 7, about 10 to about 150, about 10 to about 120, about 10 to about 100, about 10 to about 80, about 10 to about 65, about 10 to about 50, about 10 to about 30, about 10 to about 20, about 10 to about 15, or about 10 to about 12 pairs of the first and second deposited layers 504A, 516 or the second and third deposited layers 616, 618. In one or more embodiments, the protective coating 500, 600 can contain an odd number of layers such that there is an additional first deposited layer, second deposited layer, or third deposited layer, like shown in FIG. 5A.

The protective coating 200, 300, 400, 500, 600 can have a total thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating 200, 300, 400, 500, 600 can have a thickness of less than 10 μm (less than 10,000 nm). For example, the protective coating 200, 300, 400, 500, 600 can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

At block 160, an optional oxidation and annealing process is performed on the protective coating 200, 300, 400, 500, 600, as shown in FIGS. 2B, 3B, 4B, 5B, and 6B. For example, the optional annealing and oxidation process may be performed when one or more of the deposited layers are deposited in the amorphous phase. Additionally, if one or more layers are deposited by a CVD process, the CVD process may convert the one or more layers to a crystalline phase. As such, the protective coating 200, 300, 400, 500, 600 may not need to undergo the annealing and oxidation process. However, the one or more layers deposited through a CVD process may need to undergo the annealing and oxidation process to convert the one or more layers to the preferred crystalline assembly. The annealing and oxidation process may be performed at a temperature of about 500° C. to about 1,100° C.

The oxidizing process may partially oxidize the protective coating 200, 300, 400, 500, 600. In some examples, the protective coating 200, 300, 400, 500, 600 can be converted into the coalesced layer 208, 308, 408, 508, 608 during the oxidation and annealing process. During the oxidation and annealing process, the high temperature coalesces the layers within the protective coating 200, 300, 400, 500, 600 into a single structure where the new crystalline assembly enhances the integrity and protective properties of the protective coating 200 or the coalesced layer 208, 308, 408, 508, 608.

The protective coating 200, 300, 400, 500, 600 having a crystalline assembly enhances the strength, longevity, and durability of the protective coating 200, 300, 400, 500, 600, and reduces both the oxidation rate of the surface of the aerospace component 202, 302, 402, 502, 602 and the rate of depletion of aluminum from the aerospace component 202, 302, 402, 502, 602. As such, the protective coating 200, 300, 400, 500, 600 being in a crystalline phase increases the oxidation and corrosion resistance of the aerospace component 202, 302, 402, 502, 602. The annealing process can be or include a thermal anneal, a plasma anneal, an ultraviolet anneal, a laser anneal, or any combination thereof. Additionally, each deposited layer of the protective coating 200, 300, 400, 500, 600 may be annealed and oxidized individually prior to depositing another layer, rather than annealing and oxidizing all deposited layers together at the same time. Performing the optional annealing and oxidizing process may further enhance and strengthen the protective properties of the protective coating 200, 300, 400, 500, 600.

Furthermore, during the oxidation and annealing process, a layer or region 206, 306, 406, 506, 606 of the aerospace component 202, 302, 402, 502, 602 nearest the protective coating 200, 300, 400, 500, 600 is depleted of aluminum or an aluminum-rich phase, forming the intermediate region 206, 306, 406, 506, 606 disposed between the aerospace component 202, 302, 402, 502, 602 and the first deposited layer 204, 310A, 404A, 504A, 624, and further forming an aluminum oxide layer or region 204, 314, 404B, 504B, 624 in the coalesced layer 208, 308, 408, 508, 608. Aluminum from the intermediate region 206, 306, 406, 506, 606 diffuses into the coalesced layer 208, 308, 408, 508, 608, depleting the intermediate region 206, 306, 406, 506, 606 of aluminum and simultaneously forming the aluminum oxide layer or region 204, 314, 404B, 504B, 624. The aluminum oxide layer or region 204, 314, 404B, 504B, 624 is formed having a crystalline assembly.

The thickness of the intermediate region 206, 306, 406, 506, 606 may vary due to several factors, such as the amount of aluminum present in the aerospace component 202, 302, 402, 502, 602, the amount of time the protective coating 200, 300, 400, 500, 600 is annealed, and the temperature of the annealing process. However, the protective coating 200, 300, 400, 500, 600 having the preferred crystalline assembly decreases the rate of depletion of aluminum from the intermediate region 206, 306, 406, 506, 606, and further protects the aerospace component 202, 302, 402, 502, 602 from corrosion and oxidation.

The crystalline protective coatings 200, 300, 400, 500, 600 reduces the amount of nickel containing oxides formed at the surface of the aerospace component 202, 302, 402, 502, 602. For example, utilizing the protective coatings 200, 300, 400, 500, 600 results in less than 10% of nickel containing oxides from forming on the surface of the aerospace component 202, 302, 402, 502, 602, such as less than 5%.

During the oxidation and annealing process, the protective coating 200, 300, 400, 500, 600 disposed on the aerospace component 202, 302, 402, 502, 602 is heated to a temperature of greater than about 500° C. In some embodiments, the protective coating 200, 300, 400, 500, 600 disposed on the aerospace component 202, 302, 402, 502, 602 is heated to a temperature of greater than about 800° C. For example, the protective coating 200, 300, 400, 500, 600 disposed on the aerospace component 202, 302, 402, 502, 602 is heated to a temperature of about 500° C. to about 1,500° C., about 600° C. to about 1,400° C., about 700° C. to about 1,300° C., about 800° C. to about 1,200° C., about 900° C. to about 1,100° C., about 900° C. to about 1,000° C., or about 1050° C. during the oxidation and annealing process. The oxidation and annealing process may occur in an environment of air. If more than one annealing and oxidation process is performed (i.e., annealing and oxidizing deposited layers individually), each annealing and oxidizing process may occur at the same temperature, or each annealing and oxidizing process may occur at different temperatures.

The protective coating 200, 300, 400, 500, 600 can be under a vacuum at a low pressure (e.g., from about 0.1 Torr to less than 760 Torr), at ambient pressure (e.g., about 760 Torr), and/or at a high pressure (e.g., from greater than 760 Torr (1 atm) to about 3,678 Torr (about 5 atm)) during the oxidation and annealing process. The protective coating 200, 300, 400, 500, 600 can be exposed to an atmosphere containing one or more gases during the oxidation and annealing process. Exemplary gases used during the annealing process can be or include nitrogen ($N_2$), argon, helium, hydrogen ($H_2$), oxygen ($O_2$), air, or any combinations thereof. The oxidation and annealing process can be performed for about 0.01 seconds to about 10 minutes. In some examples, the oxidation and annealing process can be a thermal anneal and lasts for about 1 minute to about 24 hours, such as about 10 minutes to about 10 hours. In other examples, the oxidation and annealing process can be a laser anneal or a spike anneal and lasts for about 1 millisecond, about 100 millisecond, or about 1 second to about 5 seconds, about 10 seconds, or about 15 seconds.

The protective coating 200, 300, 400, 500, 600 can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 700 nm, about 850 nm, about 1,000 nm, about 1,200 nm, about 1,500 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating 250 or the coalesced film 240 can have a thickness of less than 10 µm (less than 10,000 nm). For example, protective coating 200, 300, 400, 500, 600 can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coating 200, 300, 400, 500, 600 can have a relatively high degree of uniformity. The protective coating 200, 300, 400, 500, 600 can have a uniformity of less than 50%, less than 40%, or less than 30% of the thickness of the respective protective coating 200, 250. The protective coating 200, 300, 400, 500, 600 can independently have a uniformity from about 0%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coating 200, 300, 400, 500, 600 can independently have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1% to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

In some embodiments, the protective coating 200, 300, 400, 500, 600 contain can be formed or otherwise produced with different ratios of metals throughout the material, such as a doping metal or grading metal contained within a base metal, where any of the metal can be in any chemically oxidized form (e.g., oxide, nitride, silicide, carbide, or combinations thereof). In one or more examples, the first deposited layer 204, 310A, 404A, 504A, 624 is deposited to first thickness and the second deposited layer 410A, 516, 616 is deposited to a second thickness, where the first thickness or less than or greater than the second thickness. For example, the first deposited layer 204, 310A, 404A, 504A, 624 can be deposited by two or more (3, 4, 5, 6, 7, 8, 9, 10, or more) ALD cycles during block 120 to produce the respectively same amount of sub-layers (e.g., one sub-layer for each ALD cycle), and then the second deposited layer 410A, 516, 616 can be deposited by one ALD cycle or a number of ALD cycles that is less than or greater than the number of ALD cycles used to deposit the first deposited layer 204, 310A, 404A, 504A, or 624. In other examples, the first deposited layer 204, 310A, 404A, 504A, 624 can be deposited by CVD to a first thickness and the second deposited layer 410A, 516, 616 is deposited by ALD to a second thickness which is less than the first thickness.

In other embodiments, an ALD process can be used to deposit the first deposited layer 204, 310A, 404A, 504A, 624 and/or the second deposited layer 410A, 516, 616 where the deposited material is doped by including a dopant precursor during the ALD process. In some examples, the dopant precursor can be included in a separate ALD cycle relative to the ALD cycles used to deposit the base material. In other examples, the dopant precursor can be co-injected with any of the chemical precursors used during the ALD cycle. In further examples, the dopant precursor can be injected separate from the chemical precursors during the ALD cycle. For example, one ALD cycle can include exposing the aerospace component to: the first precursor, a pump-purge, the dopant precursor, a pump-purge, the first reactant, and a pump-purge to form the deposited layer. In some examples, one ALD cycle can include exposing the aerospace component to: the dopant precursor, a pump-purge, the first precursor, a pump-purge, the first reactant, and a pump-purge to form the deposited layer. In other examples, one ALD cycle can include exposing the aerospace component to: the first precursor, the dopant precursor, a pump-purge, the first reactant, and a pump-purge to form the deposited layer.

In one or more embodiments, the first deposited layer 204, 310A, 404A, 504A, 624 and/or the second deposited layer 410A, 516, 616 contains one or more base materials and one or more doping materials. The base material is or contains aluminum oxide, chromium oxide, or a combination of aluminum oxide and chromium oxide. The doping material is or contains hafnium, hafnium oxide, yttrium, yttrium oxide, cerium, cerium oxide, silicon, silicon oxide, nitrides thereof, or any combination thereof. Any of the precursors or reagents described herein can be used as a doping precursor or a dopant. Exemplary cerium precursor can be or include one or more cerium(IV) tetra(2,2,6,6-tetramethyl-3,5-heptanedionate) (Ce(TMHD)$_4$), tris(cyclopentadiene) cerium (($C_5H_5)_3$Ce), tris(propylcyclopentadiene) cerium ([($C_3H_7$)$C_5H_4$]$_3$Ce), tris(tetramethylcyclopentadiene) cerium ([($CH_3)_4C_5H$]$_3$Ce), or any combination thereof.

The doping material can have a concentration of about 0.01 atomic percent (at %), about 0.05 at %, about 0.08 at %, about 0.1 at %, about 0.5 at %, about 0.8 at %, about 1 at %, about 1.2 at %, about 1.5 at %, about 1.8 at %, or about 2 at % to about 2.5 at %, about 3 at %, about 3.5 at %, about 4 at %, about 5 at %, about 8 at %, about 10 at %, about 15 at %, about 20 at %, about 25 at %, or about 30 at % within the first deposited layer 204, 310A, 404A, 504A, or 624, the second deposited layer 410A, 516, 616, the protective coating 200, 300, 400, 500, 600, and/or the coalesced layer 208, 308, 408, 508, 608. For example, the doping material can have a concentration of about 0.01 at % to about 30 at %, about 0.01 at % to about 25 at %, about 0.01 at % to about 20 at %, about 0.01 at % to about 15 at %, about 0.01 at % to about 12 at %, about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.1 at % to about 30 at %, about 0.1 at % to about 25 at %, about 0.1 at % to about 20 at %, about 0.1 at % to about 15 at %, about 0.1 at % to about 12 at %, about 0.1 at % to about 10 at %, about 0.1 at % to about 8 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 1 at % to about 30 at %, about 1 at % to about 25 at %, about 1 at % to about 20 at %, about 1 at % to about 15 at %, about 1 at % to about 12 at %, about 1 at % to about 10 at %, about 1 at % to about 8 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the first deposited layer 204, 310A, 404A, 504A, or 624, the second deposited layer 410A, 516, 616, the protective coating 200, 300, 400, 500, 600, and/or the coalesced layer 208, 308, 408, 508, 608.

In one or more embodiments, the protective coating 200, 300, 400, 500, 600 includes the first deposited layer 204, 310A, 404A, 504A, 624 containing aluminum oxide (or other base material) and the second deposited layer 410A, 516, 616 containing chromium oxide (or other doping material), or having the first deposited layer 204, 310A, 404A, 504A, 624 containing chromium oxide (or other doping material) and the second deposited layer 410A, 516, 616 containing aluminum oxide (or other base material). In one or more examples, the protective coatings 200, 300, 400, 500, 600 contain a combination of aluminum oxide and chromium oxide, a hafnium-doped aluminum oxide, hafnium aluminate, or any combination thereof. For example, the first deposited layer 204, 310A, 404A, 504A, 624 contains aluminum oxide and the second deposited layer 410A, 516, 616 contains chromium oxide, or having the first deposited layer 204, 310A, 404A, 504A, 624 contains chromium oxide and the second deposited layer 410A, 516, 616 contains aluminum oxide. In other examples, the protective coating 300, 400, 500, 600 includes the coalesced layer 208, 308, 408, 508, 608 formed from layers of aluminum oxide and chromium oxide. In one or more embodiments, the protective coating 200, 300, 400, 500, 600 has a concentration of hafnium (or other doping material) of about 0.01 at %, about 0.05 at %, about 0.08 at %, about 0.1 at %, about 0.5 at %, about 0.8 at %, or about 1 at % to about 1.2 at %, about 1.5 at %, about 1.8 at %, about 2 at %, about 2.5 at %, about 3 at %, about 3.5 at %, about 4 at %, about 4.5 at %, or about 5 at % within the coalesced layer 208, 308, 408, 508, 608 containing aluminum oxide (or other base material). For example, the protective coating 600 has a concentration of hafnium (or other doping material) of about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.01 at % to about 0.05 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 0.5 at % to about 5 at %, about 0.5 at % to about 4 at %, about 0.5 at % to about 3 at %, about 0.5 at % to about 2.5 at %, about 0.5 at % to about 2 at %, about 0.5 at % to about 1.5 at %, about 0.5 at % to about 1 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the coalesced layer 608 containing aluminum oxide (or other base material).

Figure 7B:
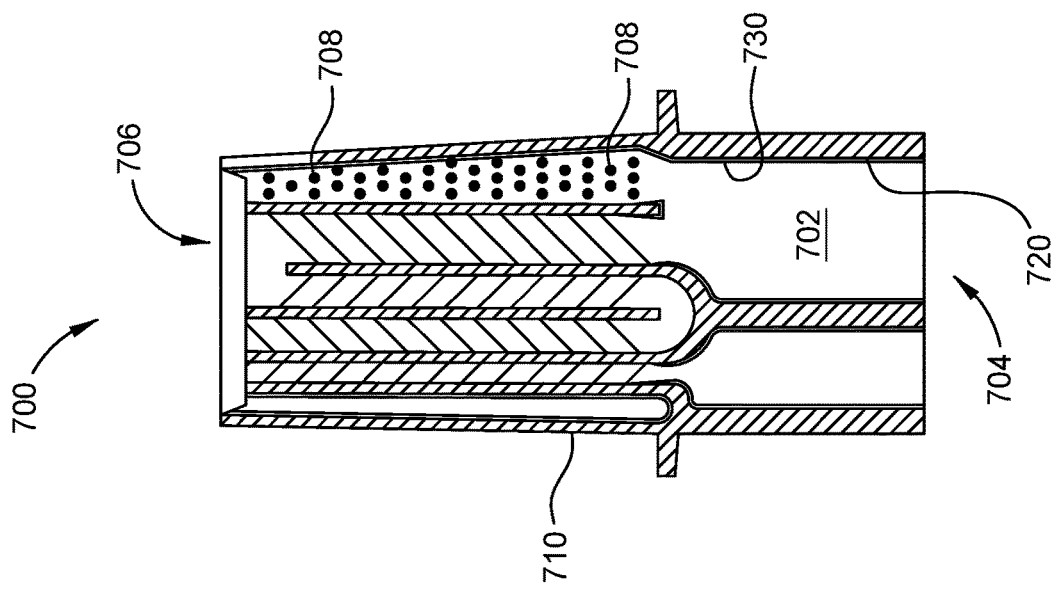
FIGS. 7A and 7B are schematic views of an aerospace component containing one or more protective coatings, according to one or more embodiments described and discussed herein.
Figure 7A:
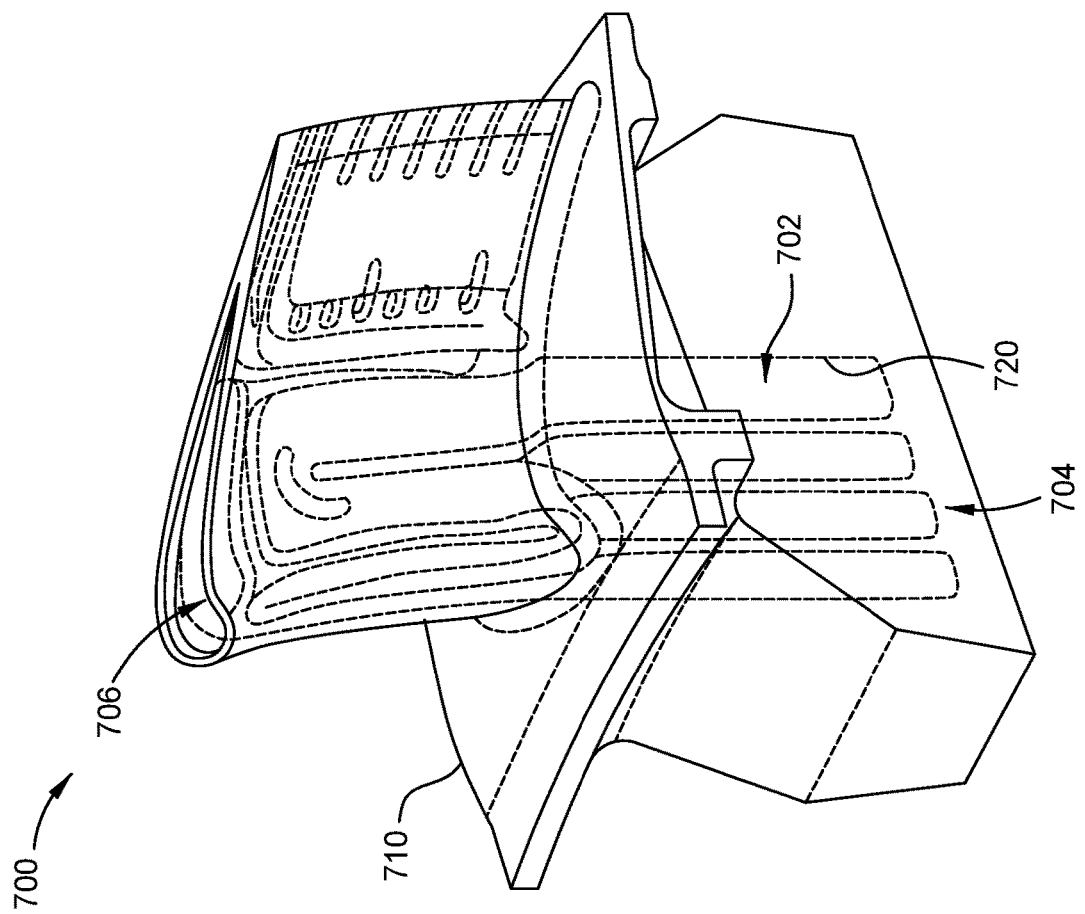

FIGS. 7A and 7B are schematic views of an aerospace component 700 comprising nickel and aluminum having a protective coating 730 disposed thereon, according to one or more embodiments described and discussed herein. FIG. 7A is a perspective view of the aerospace component 700 and FIG. 7B is a cross-sectional view of the aerospace component 700. The protective coating 730 can be or include one or more deposited layers, one or more coalesced films, or any combination thereof, as described and discussed herein. For example, the protective coating 730 can be or include one or more of the protective coating 200 of FIG. 2B, the protective coating 300 of FIG. 3B, the protective coating 400 of FIG. 4B, the protective coating 500 of FIG. 5B, and/or the protective coating 600 of FIG. 6B. Similarly, the aerospace component 700 can be or include the aerospace component 202, 302, 402, 502, 602 of FIGS. 2A-2B, FIGS. 3A-3B, FIGS. 4A-4B, FIGS. 5A-5B, and FIGS. 6A-6B, respectively. Aerospace components as described and discussed herein, including aerospace component 700, can be or include one or more components or portions thereof of a turbine, an aircraft, a spacecraft, or other devices that can include one or more turbines (e.g., compressors, pumps, turbo fans, super chargers, and the like). Exemplary aerospace components 700 can be or include a turbine blade, a turbine vane, a support member, a frame, a rib, a fin, a pin fin, a combustor fuel nozzle, a combustor shield, an internal cooling channel, or any combination thereof.

The aerospace component 700 has one or more outer or exterior surfaces 710 and one or more inner or interior surfaces 720. The interior surfaces 720 can define one or more cavities 702 extending or contained within the aerospace component 700. The cavities 702 can be channels, passages, spaces, or the like disposed between the interior surfaces 720. The cavity 702 can have one or more openings 704, 706, and 708. Each of the cavities 702 within the aerospace component 700 typically have aspect ratios (e.g., length divided by width) of greater than 1. The methods described and discussed herein provide depositing and/or otherwise forming the protective coatings 200, 300, 400, 500, 600 on the interior surfaces 720 with high aspect ratios (greater than 1) and/or within the cavities 702.

The aspect ratio of the cavity 702 can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity 702 can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component 700 and any surface thereof including one or more outer or exterior surfaces 710 and/or one or more inner or interior surfaces 720 can be made of, contain, or otherwise include one or more metals, such as nickel, aluminum, chromium, iron, titanium, hafnium, one or more nickel superalloys, one or more Inconel alloys, one or more Hastelloy alloys, one or more Monel alloys, alloys thereof, or any combination thereof. For example, the aerospace component 700 may comprise Inconel 617, Inconel 625, Inconel 718, Inconel X-750, Haynes 214 alloy, Monel 404, and/or Monel K-500. The protective coating 730 can be deposited, formed, or otherwise produced on any surface of the aerospace component 700 including one or more outer or exterior surfaces 710 and/or one or more inner or interior surfaces 720.

The protective coating, as described and discussed herein, can be or include one or more of laminate film stacks, coalesced films, graded compositions, and/or monolithic films which are deposited or otherwise formed on any surface of an aerospace component. In some examples, the protective coating contains from about 1% to about 100% chromium oxide. The protective coatings are conformal and substantially coat rough surface features following surface topology, including in open pores, blind holes, and non-line-of sight regions of a surface. The protective coatings do not substantially increase surface roughness, and in some embodiments, the protective coatings may reduce surface roughness by conformally coating roughness until it coalesces. The protective coatings may contain particles from the deposition that are substantially larger than the roughness of the aerospace component, but are considered separate from the monolithic film. The protective coatings are substantially well adhered and pinhole free. The thickness of the protective coatings varies within 1-sigma of 40%. In one or more embodiments, the thickness varies less than 1-sigma of 20%, 10%, 5%, 1%, or 0.1%.

The protective coatings provide corrosion and oxidation protection when the aerospace components are exposed to air, oxygen, sulfur and/or sulfur compounds, acids, bases, salts (e.g., Na, K, Mg, Li, or Ca salts), or any combination thereof.

One or more embodiments described herein include methods for the preservation of an underneath chromium-containing alloy using the methods producing an alternating nanolaminate of first material (e.g., chromium oxide, aluminum oxide, and/or aluminum nitride) and another secondary material. The secondary material can be or include one or more of aluminum oxide, aluminum nitride, aluminum oxynitride, silicon oxide, silicon nitride, silicon carbide, yttrium oxide, yttrium nitride, yttrium silicon nitride, hafnium oxide, hafnium silicate, hafnium silicide, hafnium nitride, titanium oxide, titanium nitride, titanium silicide, titanium silicate, dopants thereof, alloys thereof, or any combination thereof. The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor (at a temperature of about 0° C. to about 250° C.) is delivered to the aerospace component via vapor phase delivery for at pre-determined pulse length of 5 seconds. During this process, the deposition reactor is operated under a flow of nitrogen carrier gas (about 1,000 sccm total) with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, water is pulsed into the chamber for 0.1 seconds at chamber pressure of about 3.5 Torr. An additional chamber purge (or pump/purge) is then performed to rid the reactor of any excess reactants and reaction byproducts. This process is repeated as many times as necessary to get the target CrOx film to the desired film thickness.

For the secondary film (example: aluminum oxide), the precursor, trimethylaluminum (at a temperature of about 0° C. to about 30° C.) is delivered to the aerospace component via vapor phase delivery for at pre-determined pulse length of 0.1 seconds. During this process, the deposition reactor is operated under a flow of nitrogen carrier gas (100 sccm total) with the chamber held at a pre-determined temperature of about 150° C. to about 350° C. and pressure about 1 Torr to about 5 Torr. After the pulse of trimethylaluminum, the chamber is then subsequently pumped and purged of all requisite gases and byproducts for a determined amount of time. Subsequently, water vapor is pulsed into the chamber for about 0.1 seconds at chamber pressure of about 3.5 Torr. An additional chamber purge is then performed to rid the reactor of any excess reactants and reaction byproducts. This process is repeated as many times as necessary to get the target $Al_2O_3$ film to the desired film thickness. The aerospace component is then subjected to an annealing furnace at a temperature of about 500° C. under inert nitrogen flow of about 500 sccm for about one hour.

Doped/alloyed ALD Layers Processes

One or more embodiments described herein include methods for the preservation of an underlying aerospace component by using a doped chromium-containing film or a doped aluminum containing film. This film is or includes a chromium-containing film produced by using a chromium precursor or an aluminum precursor, and one or more of oxygen sources or oxidizing agents (for chromium oxide or aluminum oxide deposition), nitrogen sources or nitriding agents (for chromium nitride or aluminum nitride deposition), one or more carbon sources or carbon precursors (for chromium carbide or aluminum carbide deposition), silicon sources or silicon precursors (for chromium silicide or aluminum silicide deposition), or any combination thereof. A doping precursor (or dopant) can be or include a source for aluminum, yttrium, hafnium, silicon, tantalum, zirconium, strontium, lanthanum, neodymium, holmium, barium, lutetium, dysprosium, samarium, terbium, erbium, thulium, titanium, niobium, manganese, scandium, europium, tin, cerium, or any combination thereof. The precursors used can be or include, but is not limited to, one or more chromium precursors or one or more aluminum precursors, as described and discussed above. The chromium precursor can be used during a deposition process to produce doped film containing the ternary material (e.g., YCrO or CrAlO). The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor, bis(1,4-ditertbutyldiazadienyl chromium (II) (at a temperature of about 0° C. to about 250° C.) is delivered to the aerospace component via vapor phase delivery for at predetermined pulse length of 5 seconds. During this process, the deposition reactor is operated under a flow of nitrogen carrier gas of about 1,000 sccm with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, a second reactant, water is pulsed into the chamber for 0.1 seconds at chamber pressure of about 3.5 Torr. A second chamber purge is then performed to rid the reactor of any excess reactants and reaction byproducts. This chromium precursor/pump-purge/water/pump-purge sequence is repeated as many times as necessary to get the target CrOx film to the desired film thickness. This process results in the formation of a first CrOx laminate layer with desired thickness.

After the first CrOx laminate layer deposition, a third reactant, tetrakis(ethylmethylamino)hafnium (TEMAH) is pulsed into the chamber for 5 seconds at chamber pressure of about 1.6 Torr. A final chamber pump/purge is then performed to rid the reactor of any excess reactants and reaction byproducts. Subsequently, a second reactant, water is pulsed into the chamber for 3 seconds at chamber pressure of about 1.2 Torr. A second chamber pump/purge is then performed to rid the reactor of any excess reactants and reaction byproducts. This single sequence results in the formation of a second HfOx laminate layer with monolayer (HfOx) thickness.

This first CrOx/second HfOx laminate layer sequence is repeated as many times as necessary to get the target Hf-doped chromium oxide film (CrOx:Hf) to the desired film thickness. The resultant CrOx:Hf film can be used as a nanolaminate film stack or the film can be subjected to annealing where the high temperature activates Hf diffusion into a CrOx layers where the more uniform Hf distribution in CrOx:Hf film enhances the integrity and protective properties of this overlying film.

In a particular embodiment, the selected Al precursor, trimethylaluminum (TMAl) (at a temperature of about 0° C. to about 30° C.) is delivered to the aerospace component via vapor phase delivery for at pre-determined pulse length of about 0.1 seconds to about 1 second. During this process, the deposition reactor is operated under a flow of nitrogen carrier gas of about 100 sccm with the chamber held at a pre-determined temperature of about 150° C. to about 400° C. and pressure of about 1 Torr to about 5 Torr. After the pulse of trimethylaluminum, the chamber is then subsequently pumped and purged of all requisite gases and byproducts for a determined amount of time. Subsequently, water vapor is pulsed into the chamber for 3 seconds at chamber pressure of about 1 Torr to about 5 Torr. An additional chamber purge is then performed to rid the reactor of any excess reactants and reaction byproducts. The aluminum precursor/pump-purge/water/pump-purge sequence is repeated as many times as necessary to get the target AlOx (e.g., $Al_2O_3$) film to the desired film thickness. This process results in the formation of a first AlOx laminate layer with desired thickness.

After first AlOx laminate layer deposition, a third reactant, tetrakis(ethylmethylamino)hafnium (TEMAH) is pulsed into the chamber for about 5 seconds at chamber pressure of about 1.6 Torr. A final chamber pump/purge is then performed to rid the reactor of any excess reactants and reaction byproducts. Subsequently, a second reactant, water is pulsed into the chamber for about 3 seconds at chamber pressure of about 1.2 Torr. A second chamber pump/purge is then performed to rid the reactor of any excess reactants and reaction byproducts. This single sequence results in the formation of a second HfOx laminate layer with monolayer (HfOx) thickness.

This first AlOx/second HfOx laminate layer sequence is repeated as many times as necessary to get the target Hf-doped aluminum oxide film (AlOx:Hf) to the desired film thickness. In some examples, the resultant AlOx:Hf film is used as a nanolaminate film stack. In other examples, the resultant AlOx:Hf film is subjected to annealing where the high temperature activates Hf diffusion into a AlOx layers where the more uniform Hf distribution in AlOx:Hf film enhances the integrity and protective properties of this overlying film.

SEM shows cross-sections of ALD as-grown Hf doped $Al_2O_3$ layers on Si aerospace component. SEM shows cross-section of Hf doped $Al_2O_3$ layer with about 0.1 at % Hf concentration. The total $Al_2O_3$:Hf film thickness is about 140 nm. The film contains six $Al_2O_3/HfO_2$ laminate layers. The single $Al_2O_3/HfO_2$ laminate layer thickness is about 23 nm. SEM shows cross-section of Hf doped $Al_2O_3$ layer with about 0.5 at % Hf concentration. The total $Al_2O_3$:Hf film thickness is about 108 nm. The film contains twenty one $Al_2O_3/HfO_2$ laminate layers. The single $Al_2O_3/HfO_2$ laminate layer thickness is about 5.1 nm.

The visual differentiation of $HfO_2$ and $Al_2O_3$ layers on SEM cross section is clear seen for about 0.1 at % Hf doped sample. However SEM resolution (10 nm) limits the visual differentiation of $HfO_2$ and $Al_2O_3$ layers for about 0.5 at % Hf doped sample. SIMS is used to determine concentration depth profiles of ALD as-grown Hf doped $Al_2O_3$ layers on the aerospace component. A SIMS concentration depth profile of Hf doped $Al_2O_3$ layer is about 0.1 at % Hf concentration. The film contains six $Al_2O_3/HfO_2$ laminate layers. A SIMS concentration depth profile of Hf doped $Al_2O_3$ layer is about 0.5 at % Hf concentration. The film contains of twenty one $Al_2O_3/HfO_2$ laminate layers.

Rutherford backscattering spectrometry (RBS) provides compositional analysis data for ALD as-grown Hf doped $Al_2O_3$ layers. The RBS analysis proved what bulk $Al_2O_3$:Hf layer with six $Al_2O_3/HfO_2$ laminate layers has about 0.1 at % Hf concentration, and bulk $Al_2O_3$:Hf layer with twenty one $Al_2O_3/HfO_2$ laminate layers has about 0.5 at % Hf concentration.

In one or more embodiments, the protective coatings which include chromium containing materials are desirable for a number of applications where a stable chromium oxide forms in air to protect the surface from oxidation, acid attack, and sulfur corrosion. In the instance of Fe, Co, and/or Ni-based alloys, chromium oxides (as well as aluminum oxides) are formed selectively to create a passivated surface. However, prior to forming this selective oxide layer, other metallic elements will oxidize until the chromium oxide forms a continuous layer.

After the formation of a dense chromium oxide layer, exposure to high temperatures (e.g., greater than 500° C.) in air causes thickening of the chromium oxide scale, where chromium diffuses out of the bulk metal and into the scale, and oxygen diffuses from the air into the scale. Over time, the scale growth rate slows as the scale thickens because (1) oxygen diffusion is slower and (2) chromium becomes depleted in the bulk alloy. For alloys, if the chromium concentration falls below a threshold, other oxides may begin to form which cause the spallation or failure of the previously protective scale.

To extend the life of a chromium-containing alloy, one or more of the following methods can be used. In one or more embodiments, the method can include depositing an oxide layer matching the composition and crystal structure of the native oxide to produce the protective coating. In other embodiments, the method can include depositing an oxide layer with a different crystal structure to the native oxide to produce the protective coating. In some embodiments, the method can include depositing an oxide layer with additional dopants that would not be present in the native oxide to produce the protective coating. In other embodiments, the method can include depositing another oxide (e.g., silicon oxide or aluminum oxide) as a capping layer or in a multi-layer stack to produce the protective coating.

In one or more embodiments of the method, a non-native oxide may be initially deposited onto the surface of the metal surface of aerospace component or other substrate that effectively thickens the oxide, thereby slowing oxygen diffusion toward the metal surface and resulting in slower absolute thicknesses growth of the oxide film. In some examples, a benefit of this approach can be contemplated in the context of a parabolic oxide scale growth curve. At thicker scales (e.g., greater than 0.5 micron to about 1.5 micron), the rate of scale thickness decreases versus initial growth. By depositing an oxide film having a thickness of about 100 nm, about 200 nm, or about 300 nm to about 1 micron, about 2 micron, or about 3 micron prior to the growth of a thick scale. The effective growth rate of the first thickness of about 0.5 micron to about 1 micron of native scale can be much slower over a given period of time. In turn, the rate of depletion of chromium from the substrate can be slower, and the time a surface can be exposed to the environment can be longer.

Oxygen diffusion can further be slowed by depositing a predetermined crystalline structure of chromium oxide, e.g., amorphous. Oxygen can diffuse along grain boundaries faster than in bulk crystals for chromium oxide, so minimizing grain boundaries can be beneficial for slowing oxygen diffusion. In turn, scale growth can be slower, and the time a surface can be exposed to the environment can be longer.

In other embodiments, the method can include incorporating one or more dopants into the deposited oxide while producing the protective coating. The dopant can be or include a source for aluminum, yttrium, hafnium, silicon, tantalum, zirconium, strontium, lanthanum, neodymium, holmium, barium, lutetium, dysprosium, samarium, terbium, erbium, thulium, titanium, niobium, manganese, scandium, europium, tin, cerium, or any combination thereof. The dopant can segregate to grain boundaries and modify grain boundary diffusion rates to slow the rate of oxide scale growth.

In one or more embodiments, an aerospace component includes a coating disposed on a surface of a substrate. The surface or substrate includes or contains nickel, nickel superalloy, aluminum, chromium, iron, titanium, hafnium, alloys thereof, or any combination thereof. The coating has a thickness of less than 10 µm and contains an aluminum oxide layer. In some examples, the surface of the aerospace component is an interior surface within a cavity of the aerospace component. The cavity can have an aspect ratio of about 5 to about 1,000 and the coating can have a uniformity of less than 30% of the thickness across the interior surface.

The crystalline protective coatings described above reduce the amount of nickel containing oxides formed at the surface of the aerospace component and further decreases the rate of aluminum depletion from the aerospace component. For example, utilizing the protective coatings results in less than 10% of nickel containing oxides from forming on the surface of the aerospace component such as less than 5%. Moreover, the protective coating having a crystalline assembly enhances the integrity and protective properties of the protective coating, as well as enhancing the strength, longevity, and durability of the protective coating. Utilizing the protective coating further reduces the oxidation rate of the surface of the aerospace component, increasing the oxidation and corrosion resistance of the aerospace component. By depositing the protective coating using ALD or CVD, the protective coating is substantially conformal.

While the foregoing is directed to examples of the present disclosure, other and further examples of the disclosure may be devised without departing from the basic scope thereof, and the scope thereof is determined by the claims that follow.

What is claimed is:

1. A method for depositing a coating on an aerospace component, comprising:
    depositing a first deposited layer on a surface of an aerospace component by a chemical vapor deposition (CVD) process, the aerospace component comprising nickel and aluminum;
    converting the first deposited layer to a crystalline phase; and
    forming an aluminum oxide region between the first deposited layer and the aerospace component, the aluminum oxide region having a crystalline assembly,
    wherein the first deposited layer and the aluminum oxide region form a protective coating directly on the aerospace component, the protective coating formed conformally and following a surface topology of the aerospace component; and
    wherein the protective coating protects the aerospace component from corrosion and oxidation and decreases a rate of depletion of aluminum from the aerospace component.

2. The method of claim 1, further comprising:
    depositing a second deposited layer on the first deposited layer by a second CVD process or an atomic layer deposition (ALD) process prior to converting the first deposited layer to a crystalline phase,
    wherein the first deposited layer and the second deposited layer have different compositions from each other, and
    wherein converting the first deposited layer to a crystalline phase further comprises forming a coalesced layer having the crystalline phase.

3. The method of claim 2, wherein the first deposited layer comprises aluminum oxide and the second deposited layer comprises chromium oxide.

4. The method of claim 2, further comprising:
    depositing one or more additional deposited layers on the second deposited layer prior to converting the first and second deposited layers to the crystalline phase; and
    converting the first deposited layer, the second deposited layer, and the one or more additional deposited layers to a coalesced layer having a crystalline phase.

5. The method of claim 4, further comprising an intermediate region imposed between the coalesced layer and the aerospace component, the intermediate region comprising an aluminum depleted region of the aerospace component.

6. The method of claim 1, wherein the first deposited layer comprises chromium oxide, and wherein forming the aluminum oxide region forms a coalesced layer comprising chromium oxide, aluminum oxide, and a mixed chromium-aluminum oxide.

7. The method of claim 6, wherein the first deposited layer is deposited at a temperature of about 300 degrees Celsius to about 1100 degrees Celsius.

8. The method of claim 1, wherein the aluminum oxide region is formed by annealing the first deposited layer at a temperature between about 500 degrees Celsius to about 1100 degrees Celsius for a time period of about 1 hour to about 15 hours.

9. A method for depositing a coating on an aerospace component, comprising:
depositing a first deposited layer on a surface of an aerospace component by a chemical vapor deposition (CVD) process or an atomic layer deposition (ALD) process, the aerospace component comprising nickel and aluminum;
performing a first annealing and oxidizing process to convert the first deposited layer into a preferred crystalline phase;
depositing a second deposited layer by the CVD process or the ALD process on the first deposited layer; and
performing a second annealing and oxidizing process to convert the second deposited layer into the preferred crystalline phase,
wherein the first deposited layer and the second deposited layer form a protective coating directly on the aerospace component, the protective coating formed conformally and following a surface topology of the aerospace component; and
wherein the protective coating protects the aerospace component from corrosion and oxidation and decreases a rate of depletion of aluminum from the aerospace component.

10. The method of claim 9, wherein the first deposited layer comprises chromium oxide and the second deposited layer comprises aluminum oxide.

11. The method of claim 9, an aluminum oxide region is formed between the first deposited layer and the aerospace component, the aluminum oxide region having a crystalline assembly.

12. The method of claim 9, wherein the first deposited layer comprising aluminum, wherein the second deposited layer comprises chromium, and wherein the first annealing and oxidation process and the second annealing and oxidizing process are performed at a temperature between about 500 degrees Celsius to about 1200 degrees Celsius for a time period of about 1 hour to about 15 hours in air.

* * * * *